United States Patent
Negoro et al.

(10) Patent No.: US 9,231,059 B2
(45) Date of Patent: Jan. 5, 2016

(54) SEMICONDUCTOR DEVICE AND METHOD OF MANUFACTURING THE DEVICE

(71) Applicant: Panasonic Corporation, Osaka (JP)

(72) Inventors: Noboru Negoro, Osaka (JP); Hidekazu Umeda, Osaka (JP); Nanako Hirashita, Shizuoka (JP); Tetsuzo Ueda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/103,155

(22) Filed: Dec. 11, 2013

(65) Prior Publication Data

US 2014/0097433 A1 Apr. 10, 2014

Related U.S. Application Data

(63) Continuation of application No. PCT/JP2012/003708, filed on Jun. 6, 2012.

(30) Foreign Application Priority Data

Jun. 13, 2011 (JP) .................................. 2011-131581
Feb. 24, 2012 (JP) .................................. 2012-038446

(51) Int. Cl.
*H01L 31/102* (2006.01)
*H01L 29/205* (2006.01)
(Continued)

(52) U.S. Cl.
CPC .......... *H01L 29/205* (2013.01); *H01L 21/8258* (2013.01); *H01L 27/0605* (2013.01);
(Continued)

(58) Field of Classification Search
CPC ................... H01L 29/66431; H01L 29/66462; H01L 29/778; H01L 29/2003; H01L 29/205; H01L 29/475; H01L 29/7786; H01L 29/04; H01L 21/8258; H01L 27/0605; H01L 21/02381; H01L 21/0262; H01L 21/0254

USPC ............ 257/51, 194, 201, 76, 189, 200, 614; 438/167, 172

See application file for complete search history.

(56) References Cited

U.S. PATENT DOCUMENTS

2003/0042496 A1  3/2003  Sasaoka
2006/0197175 A1  9/2006  Yanagihara et al.
(Continued)

FOREIGN PATENT DOCUMENTS

CN   100466172 A   3/2009
JP   2006-032650 A  2/2006
(Continued)

OTHER PUBLICATIONS

Oka et al., "AlGaN/GaN Recessed MIS-Gate HFET With High-Threshold-Voltage Normally-Off Operation for Power Electronics Applications," IEEE Electron Device Letters, vol. 29, No. 7, Jul. 2008, pp. 668-670.

(Continued)

*Primary Examiner* — Jarrett Stark
*Assistant Examiner* — Shahed Ahmed
(74) *Attorney, Agent, or Firm* — McDermott Will & Emery LLP

(57) ABSTRACT

A semiconductor device includes a substrate; a carrier traveling layer formed on the substrate, made of first group III nitride semiconductor, and containing carriers traveling in a direction along a principal surface of the substrate; a barrier layer formed on the carrier traveling layer and made of second group III nitride semiconductor having a wider band gap than the first group III nitride semiconductor; and an electrode formed on the barrier layer. The device further includes a cap layer formed on the barrier layer at a side of the electrode, and made of third group III nitride semiconductor containing a mixture of single crystals and polycrystals.

18 Claims, 25 Drawing Sheets

(51) Int. Cl.

| | |
|---|---|
| *H01L 29/66* | (2006.01) |
| *H01L 29/872* | (2006.01) |
| *H01L 29/20* | (2006.01) |
| *H01L 21/8258* | (2006.01) |
| *H01L 27/06* | (2006.01) |
| *H01L 29/04* | (2006.01) |
| *H01L 29/47* | (2006.01) |
| *H01L 29/778* | (2006.01) |
| *H01L 21/02* | (2006.01) |

(52) U.S. Cl.
CPC ............ *H01L29/04* (2013.01); *H01L 29/2003* (2013.01); *H01L 29/475* (2013.01); *H01L 29/66462* (2013.01); *H01L 29/7786* (2013.01); *H01L 29/872* (2013.01); *H01L 21/0254* (2013.01); *H01L 21/0262* (2013.01); *H01L 21/02381* (2013.01); *H01L 21/02458* (2013.01)

(56) References Cited

U.S. PATENT DOCUMENTS

| | | |
|---|---|---|
| 2006/0273347 A1 | 12/2006 | Hikita et al. |
| 2008/0067546 A1 | 3/2008 | Murata et al. |
| 2009/0121775 A1 | 5/2009 | Ueda et al. |
| 2010/0327293 A1 | 12/2010 | Hikita et al. |
| 2011/0266554 A1 | 11/2011 | Hikita et al. |
| 2012/0238063 A1* | 9/2012 | Murphy et al. ............... 438/172 |
| 2012/0299011 A1 | 11/2012 | Hikita et al. |
| 2013/0252386 A1* | 9/2013 | Sheppard et al. ............. 438/172 |

FOREIGN PATENT DOCUMENTS

| | | | |
|---|---|---|---|
| JP | 2006-156429 A | | 6/2006 |
| JP | 2006-339561 A | | 12/2006 |
| JP | 2007-019309 A | | 1/2007 |
| JP | 2007-066963 A | | 3/2007 |
| JP | 2007-096203 A | | 4/2007 |
| JP | 2008-244002 A | | 10/2008 |
| JP | 2009-054807 A | | 3/2009 |
| JP | 2009-059946 A | | 3/2009 |
| JP | 2010-225765 | * | 10/2010 |
| JP | 2011-040500 A | | 2/2011 |
| WO | 2010/109566 A1 | | 9/2010 |
| WO | 2011/005444 A1 | | 1/2011 |

OTHER PUBLICATIONS

International Search Report issued in International Application No. PCT/JP2012/003708 mailed Jul. 17, 2012, with English translation, 5 pgs.
Search Report (English translation) of an Office Action issued on Oct. 29, 2015, in counterpart Chinese Application No. 201280024242.3
Chinese Office Action in counterpart Chinese Application No. 201280024242.3, dated Oct. 29, 2015.

* cited by examiner

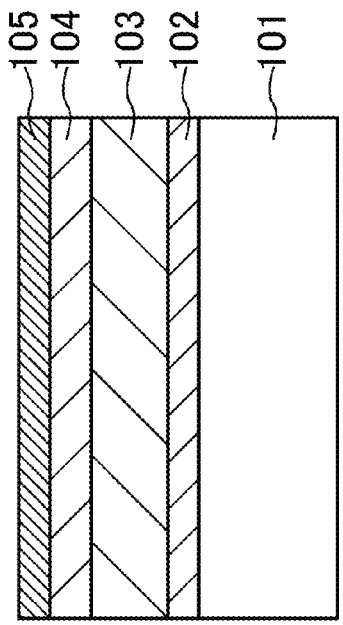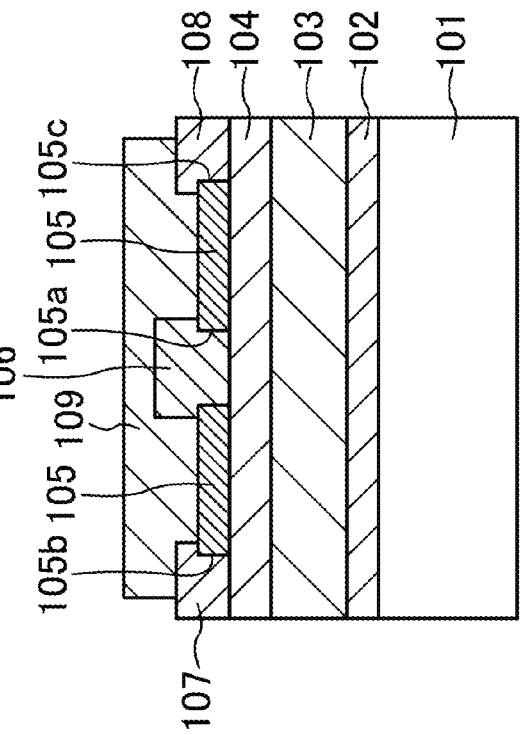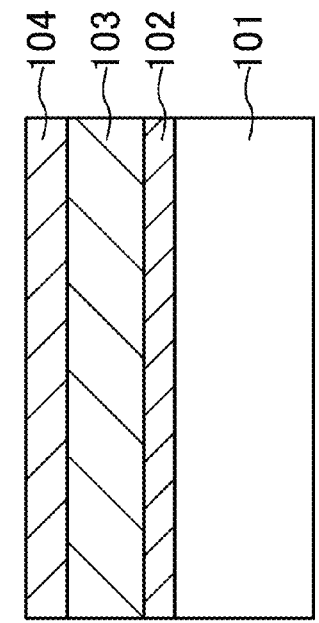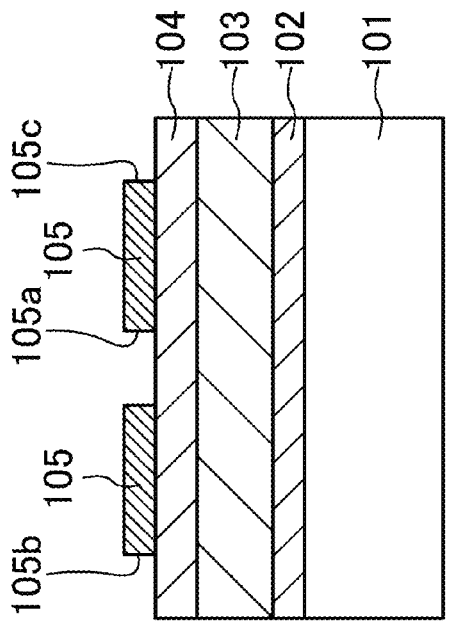

SEMICONDUCTOR DEVICE AND METHOD OF MANUFACTURING THE DEVICE

CROSS-REFERENCE TO RELATED APPLICATIONS

This is a continuation of International Application No. PCT/JP2012/003708 filed on Jun. 6, 2012, which claims priority to Japanese Patent Application No. 2011-131581 filed on Jun. 13, 2011 and Japanese Patent Application No. 2012-038446 filed on Feb. 24, 2012. The entire disclosures of these applications are incorporated by reference herein.

BACKGROUND

The present disclosure relates to semiconductor devices made of group III nitride semiconductor exhibiting normally off characteristics and methods of manufacturing the devices, and more particularly to group III nitride semiconductor devices increasing operating currents and reducing on-resistance and methods of manufacturing the devices.

Application of group III nitride semiconductor to switching devices, high-output devices, and high-frequency devices are actively researched and developed due to its physical characteristics of a wide band gap, high breakdown field strength, and saturated electron drift velocity.

In particular, the following methods using a heterojunction field effect transistor (hereinafter referred to as "HFET" or simply referred to as "FET") utilizing two-dimensional electron gas (hereinafter referred to as "2DEG") generated at the interface between an $Al_xGa_{1-x}N$ layer, where $0<x\leq1$, and a GaN layer, which are sequentially epitaxially grown on a semiconductor substrate, have been reported. Controlling a threshold voltage using a gate recess structure (see, for example, T. Oka et al., AlGaN/GaN Recessed MIS-Gate HFET with High-Threshold-Voltage Normally-Off Operation for Power Electronics Applications, IEEE ELECTRON DEVICE LETTERS, VOL. 29, NO. 7, pp. 668-670, 2008). Using a p-type gate control layer (see, for example, Japanese Patent Publication No. 2006-339561 and Japanese Patent Publication No. 2007-019309). Providing normally off operation by forming an AlGaN layer being a normally off barrier layer with a reduced thickness, etc.

SUMMARY

However, the device of Oka et al. performs normally off operation by etching not only an AlGaN bather layer, but also an underlying GaN layer provided with a channel as a gate recess region for forming. This increases the channel resistance at the portion of the GaN layer directly under a gate, thereby increasing on-resistance to cause difficulty in increasing current.

While the device using the p-type gate control layer has the advantage of raising the band level with the gate control layer, there is a need to increase sheet resistance to some extent to provide normally off operation, thereby increasing on-resistance.

Providing normally off operation by largely reducing the thickness of the portion of an AlGaN barrier layer directly under a gate by etching has also been reported. However, there is a need to control the barrier layer in several nm, and it is difficult to perform normally off operation uniformly on the surface.

In view of the problem, it is an objective of the present disclosure to provide a semiconductor device made of group III nitride semiconductor (e.g., GaN, AlGaN, InGaN, InAlGaN, or other alloys or multilayers containing GaN) reducing on-resistance and increasing current.

In order to achieve the objective, the semiconductor device according to the present disclosure includes a substrate, a carrier traveling layer formed on the substrate, made of first group III nitride semiconductor, and containing carriers traveling in a direction along a principal surface of the substrate; a barrier layer formed on the carrier traveling layer and made of second group III nitride semiconductor having a wider band gap than the first group III nitride semiconductor; an electrode formed on the barrier layer; and a cap layer formed on the barrier layer at a side of the electrode, and made of third group III nitride semiconductor containing a mixture of single crystals and polycrystals.

In the semiconductor device according to the present disclosure, the cap layer formed on the barrier layer is made of the third group III nitride semiconductor containing the mixture of single crystals and polycrystals. Thus, the cap layer polarizes the carrier traveling layer. This polarization effect generates high-concentration carriers at the interface between the barrier layer and the carrier traveling layer, thereby reducing the on-resistance of the semiconductor device, and increases the amount of current.

A method of manufacturing a semiconductor device according to the present disclosure includes forming a carrier traveling layer made of first group III nitride semiconductor on a substrate; forming a barrier layer made of second group III nitride semiconductor on the carrier traveling layer; forming a cap layer made of third group III nitride semiconductor to cover the barrier layer; selectively removing part of the cap layer; and after the removing the part of the cap layer, forming an electrode on the barrier layer. The cap layer is formed by metal-organic chemical vapor deposition (MOCVD). A temperature for forming the cap layer is lower than a temperature for forming the carrier traveling layer and a temperature for forming the barrier layer.

In the method of manufacturing the semiconductor device according to the present disclosure, due to the MOCVD, the temperature for forming the cap layer is lower than the temperature for forming the carrier traveling layer, and the temperature for forming the barrier layer. Then, the single crystals and the polycrystals are mixed in the third group III nitride semiconductor forming the cap layer. As a result, the cap layer polarizes the carrier traveling layer. This polarization effect generates high-concentration carriers at the interface between the barrier layer and the carrier traveling layer, thereby reducing the on-resistance of the semiconductor device, and increasing the amount of current.

The semiconductor device made of group III nitride semiconductor and a method of manufacturing the device according to the present disclosure generate high-concentration carriers in the carrier traveling layer, thereby reducing the on-resistance, and increasing the operating current.

BRIEF DESCRIPTION OF THE DRAWINGS

FIGS. 2A-2D are cross-sectional views illustrating a method of the semiconductor device according to the first embodiment in order of steps.

DETAILED DESCRIPTION

First Embodiment

A semiconductor device according to a first embodiment of the present disclosure will be described hereinafter with reference to the drawings.

1A. Device Structure

Figure 1:
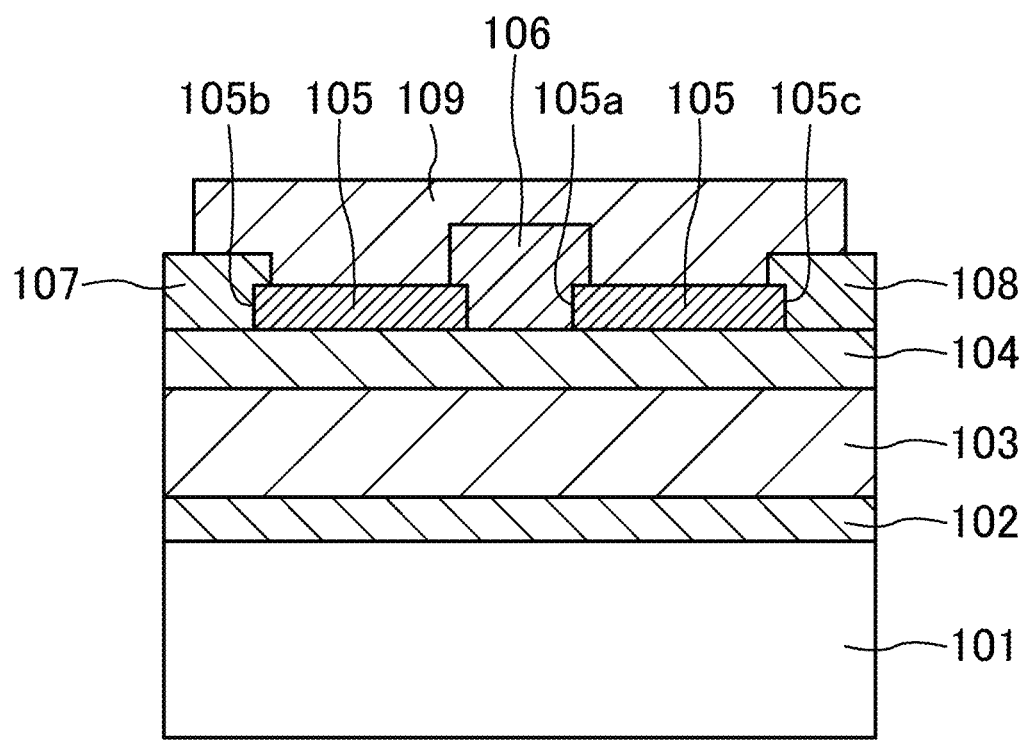
FIG. 1 is a schematic cross-sectional view illustrating a semiconductor device according to a first embodiment of the present disclosure.

FIG. 1 schematically illustrates the cross-sectional structure of the semiconductor device according to the first embodiment, which is made of group III nitride semiconductor. As shown in FIG. 1, a FET, which is the semiconductor device of this embodiment, is formed by sequentially stacking a buffer layer 102, a carrier traveling layer 103, and a barrier layer 104 on the principal surface of a substrate 101. The substrate 101 is made of silicon (Si). Its plane orientation is the (111) plane. The buffer layer 102 is a single layer of aluminum gallium nitride ($Al_yGa_{1-y}N$, where $0 \leq y \leq 1$) or a multilayer of layers with different Al compositions, and has a thickness ranging from about 200 nm to about 3500 nm. The carrier traveling layer 103 and the barrier layer 104 are made of group III nitride semiconductor.

A cap layer 105, which is made of group III nitride semiconductor containing a mixture of single crystals and polycrystals, is formed on the barrier layer. The group III nitride semiconductor used here is preferably $Al_zGa_{1-z}N$, where $0 \leq z \leq 1$. The following Table 1 shows example compositions and thicknesses of the layers from the carrier traveling layer 103 to the cap layer 105.

TABLE 1

| | Al Composition | Thickness (nm) |
|---|---|---|
| Carrier Traveling Layer 103 | 0 | 400 |
| Barrier Layer 104 | 0.2 | 10 |
| Cap Layer 105 | 1 | 40 |

The cap layer may partially include a single crystal region in the direction along the interface with the barrier layer.

The single crystal region may be formed non-uniformly in the thickness direction wholly or insularly on the interface with the barrier layer.

The cap layer may be a double layer of a single crystal layer and a polycrystal layer, which are stacked on the barrier layer.

The single crystal region is preferably in contact with the barrier layer.

The group III nitride semiconductor will be described later, which forms the cap layer 105 and contains the mixture of the single crystals and polycrystals.

A first opening 105a exposing the barrier layer 104 is formed in the cap layer 105. In the first opening 105a, a gate electrode 106 for bias application is formed in contact with the barrier layer 104.

On the both sides of the gate electrode 106 on the barrier layer 104, a source electrode 107 and a drain electrode 108 for bias application are formed in contact with the barrier layer 104 through a second opening 105b and a third opening 105c, respectively. The second and third openings 105b and 105c are formed in the cap layer 105.

A passivation film 109 made of, for example, silicon nitride (SiN) is formed above the gate electrode 106, the source electrode 107 and the drain electrode 108.

The plane orientation of the principal surface of the substrate 101 is the (111) plane. Thus, the principal surface, i.e., the growth surface, of the group III nitride semiconductor layer formed on the (111) plane is the (0001) plane, what is called "c-plane."

The FET according to this embodiment has a gate length of, for example, 0.7 μm. The distance between the gate electrode 106 and the source electrode 107, and the distance between the gate electrode 106 and the drain electrode 108 are both, for example, 0.8 μm.

1B. Manufacturing Method

An example method of manufacturing the semiconductor device according to the first embodiment having the above-described features will be described below with reference to FIGS. 2A-2D.

First, as shown in FIG. 2A, the buffer layer 102, the carrier traveling layer 103, and the barrier layer 104 are sequentially epitaxially grown on the principal surface of the substrate 101 using a crystal growth device for performing metal-organic chemical vapor deposition (MOCVD). The buffer layer 102 has a thickness ranging from about 200 nm to about 3500 nm, and is a single layer of $Al_xGa_{1-x}N$, where $0<x\leq1$, or a multilayer of layers with different Al compositions. The carrier traveling layer 103 has a thickness of 400 nm, and is made of GaN. The barrier layer 104 has a thickness of 10 nm, and is made of $Al_{0.2}Ga_{0.8}N$. As such, a multilayer of the plurality of group III nitride semiconductor materials are formed. The material gas is trimethylgallium (TMG), trimethylaluminum (TMA), and ammonia ($NH_3$).

The following Table 2 shows example crystal growth temperatures, example growth pressure, and example flow rates of the material gases. The crystal growth temperature here is preferably 1000° C. or higher, and may be, for example, 1100° C.

Next, as shown in FIG. 2B, the cap layer 105 is formed on the barrier layer 104 at a growth temperature ranging, for example, from 600° C. to 900° C., both inclusive, which is lower than that of the barrier layer 104 or the carrier traveling layer 103. The cap layer 105 has a thickness of 20 nm, and is made of group III nitride semiconductor containing a mixture of single crystals and polycrystals. For example, the cap layer 105 made of AlN is formed here. The crystal growth of the cap layer 105 made of AlN containing the mixture of single crystals and polycrystals is performed under reduced pressure of, for example, 13.3 kPa (=100 Torr). The group III material is trimethylaluminum (TMA). The group V material is ammonia ($NH_3$). The carrier gas is hydrogen ($H_2$). The flow rates of TMA and ammonia are 100 sccm and 8 slm, respectively. The units "sccm" and "slm" here represent the flow rates. Specifically, 1 sccm represents the flow rate where gas of 1 milliliter flows under standard conditions (i.e., 0° C., 1 atmosphere) for 1 minute, while 1 slm represents the flow rate where gas of 1 litter flows under standard conditions for 1 minute.

After that, as shown in FIG. 2C, a resist pattern (not shown) exposing a region for forming a gate electrode is formed on the cap layer 105. Then, the cap layer 105 is wet etched using the formed resist pattern as a mask. As a result, the first opening 105a is formed in the cap layer 105. At this time, the unmasked region of the cap layer 105 is easily removed with an alkaline etchant such as an alkaline developer. Therefore, the cap layer 105 is selectively and easily etched using a resist mask pattern, and the barrier layer 104 as an etch stop layer. Similar to the first opening 105a, the second opening 105b and the third opening 105c are formed in the cap layer 105. These openings 105a, 105b, and 105c may be formed at the same time, or in the opposite order.

Next, as shown in FIG. 2D, the source electrode 107 and the drain electrode 108, each of which is a multilayer of titanium (Ti) and aluminum (Al), are formed above the cap layer 105 by sputtering, vacuum vapor deposition, etc. using a mask pattern (not shown) exposing the second opening 105b and the third opening 105c to fill the openings 105b and 105c. After that, the source electrode 107 and the drain electrode 108 are subjected to suitable heat treatment to form ohmic contacts. The gate electrode 106 is formed similarly. The gate electrode 106, which is a multilayer of nickel (Ni) and gold (Au), is formed by vacuum vapor deposition, etc. to fill the opening 105a. Then, the passivation film 109 made of SiN is formed above the cap layer 105, the gate electrode 106, the source electrode 107 and the drain electrode 108.

1C. Aluminum Nitride (AlN) Containing Mixture of Single Crystals and Polycrystals AlN forming the cap layer 105 and containing a mixture of single crystals and polycrystals will be described below.

Figure 3:
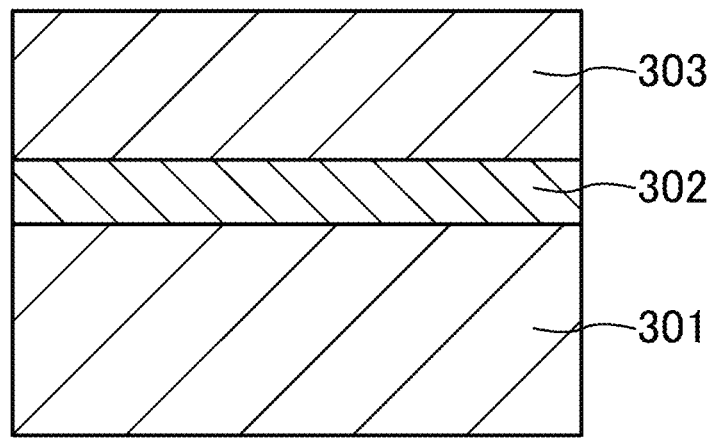
FIG. 3 is a cross-sectional view illustrating a layer structure including a low temperature grown AlN layer in the semiconductor device according to the first embodiment.

As shown in FIG. 3, a GaN layer 301 is formed on a Si substrate (not shown), whose plane orientation is the (111) plane, similarly to the buffer layer 102 and the carrier traveling layer 103 shown in FIGS. 1-2D. Then, a spacer layer 302 made of AlN is formed on the GaN layer 301 at a crystal growth temperature of 1120° C. to have a thickness of 2 nm.

TABLE 2

| Crystal | Growth Temperature (° C.) | Pressure (kPa) | Row Rate of TMA Gas (sccm) | Row Rate of TMG Gas (sccm) | Row Rate of Group V Gas (slm) |
| --- | --- | --- | --- | --- | --- |
| Carrier Traveling Layer 103 | 1100 | 13.3 | — | 100 | 8 |
| Barrier Layer 104 | 1120 | 13.3 | 30 | 15 | 8 |
| Cap Layer 105 | 600-900 | 13.3 | 100 | — | 8 |

After that, a low-temperature AlN layer 303 is formed on the spacer layer 302 using the crystal growth temperature as a parameter.

The plane orientation of the principal surface of the GaN layer 301 and the principal surface of the MN spacer layer 302 is the (0001) plane.

Figure 4:
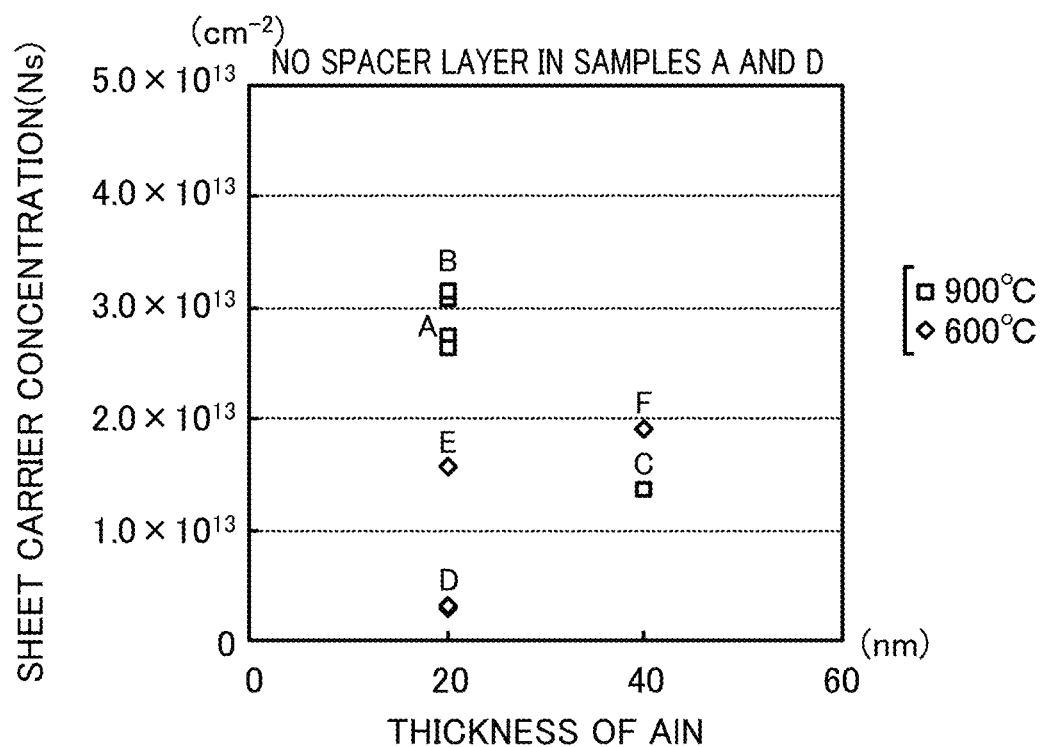
FIG. 4 is a graph illustrating the dependency of a sheet carrier concentration on the thickness of a low-temperature AlN layer and a growth temperature near the interface between a GaN layer and the low-temperature AlN layer in the semiconductor device according to the first embodiment.

The sheet carrier concentration (Ns) at the interface between the GaN layer 301 and the spacer layer 302 has been measured. As comparison examples, structures without the spacer layer 302 have been studied. In each example without the spacer layer 302, the sheet carrier concentration at the interface between the GaN layer 301 and the low-temperature AlN layer 303 has been measured. FIG. 4 illustrates the result. In FIG. 4, reference characters A-F are defined in Table 3. In Table 3, the thickness (nm) represents the thickness of the low-temperature AlN layer 303.

TABLE 3

| Character of Sample | Growth Temperature (° C.) | Thickness (nm) | With/Without AlN Spacer Layer 302 |
|---|---|---|---|
| A (Sample A) | 900 | 20 | without |
| B (Sample B) | 900 | 20 | with |
| C (Sample C) | 900 | 40 | with |
| D (Sample D) | 600 | 20 | without |
| E (Sample E) | 600 | 20 | with |
| F (Sample F) | 600 | 40 | with |

In the samples A and B, where the crystal growth temperature is 900° C. and the low-temperature AlN layer 303 has a small thickness, the sheet carrier concentration at the interface between the GaN layer 301 and the low-temperature AlN layer 303 or between the GaN layer 301 and the spacer layer 302 was about $3 \times 10^{13}$ cm$^{-2}$. By contrast, in the sample C, where the low-temperature AlN layer 303 has a great thickness, a crack occurred at the surface, thereby reducing the sheet carrier concentration to about $1.3 \times 10^{13}$ cm$^{-2}$.

On the other hand, in the sample D where the crystal growth temperature is 600° C. and the spacer layer 302 is not provided, the sheet carrier concentration was $0.3 \times 10^{13}$ cm$^{-2}$. By contrast, in the sample E with the spacer layer 302, the sheet carrier concentration was $1.6 \times 10^{13}$ cm$^{-2}$. In the sample F, where the low-temperature AlN layer 303 has a great thickness, the sheet carrier concentration was $1.9 \times 10^{13}$ cm$^{-2}$. That is, the following facts were found. Where the crystal growth temperature is 600° C., the sheet carrier concentration is increased by providing the AlN the spacer layer 302 between the GaN layer 301 and the low-temperature AlN layer 303. Even if the thickness of the low-temperature AlN layer 303 increases, no crack occurs at the surface to increase the sheet carrier concentration.

Next, a result of observation of the sample F using a transmission electron microscope (TEM) will be described. In the sample F, the crystal growth temperature is 600° C., the spacer layer 302 is provided, and the low-temperature AlN layer 303 has a great thickness.

Figure 5A:
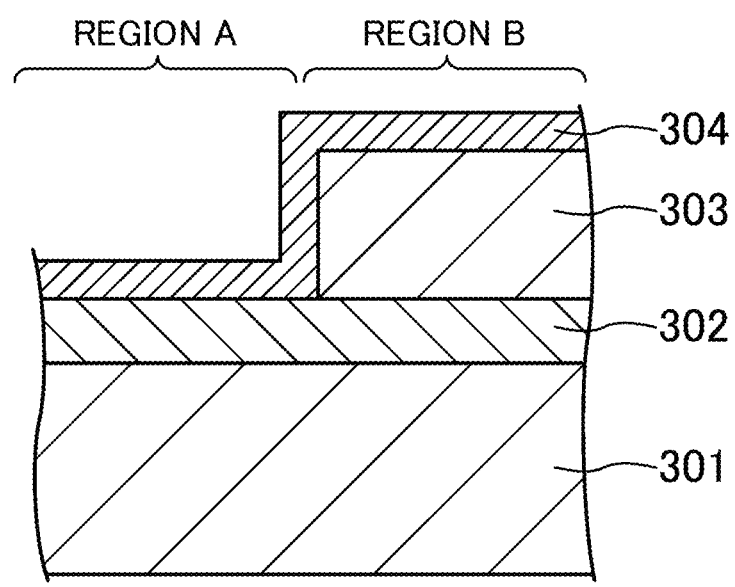
FIG. 5A is a schematic cross-sectional view illustrating the semiconductor device according to the first embodiment in positions whose observation results with a transmission electron microscope (TEM) are shown in FIGS. 5B and 5C.
Figure 5B:
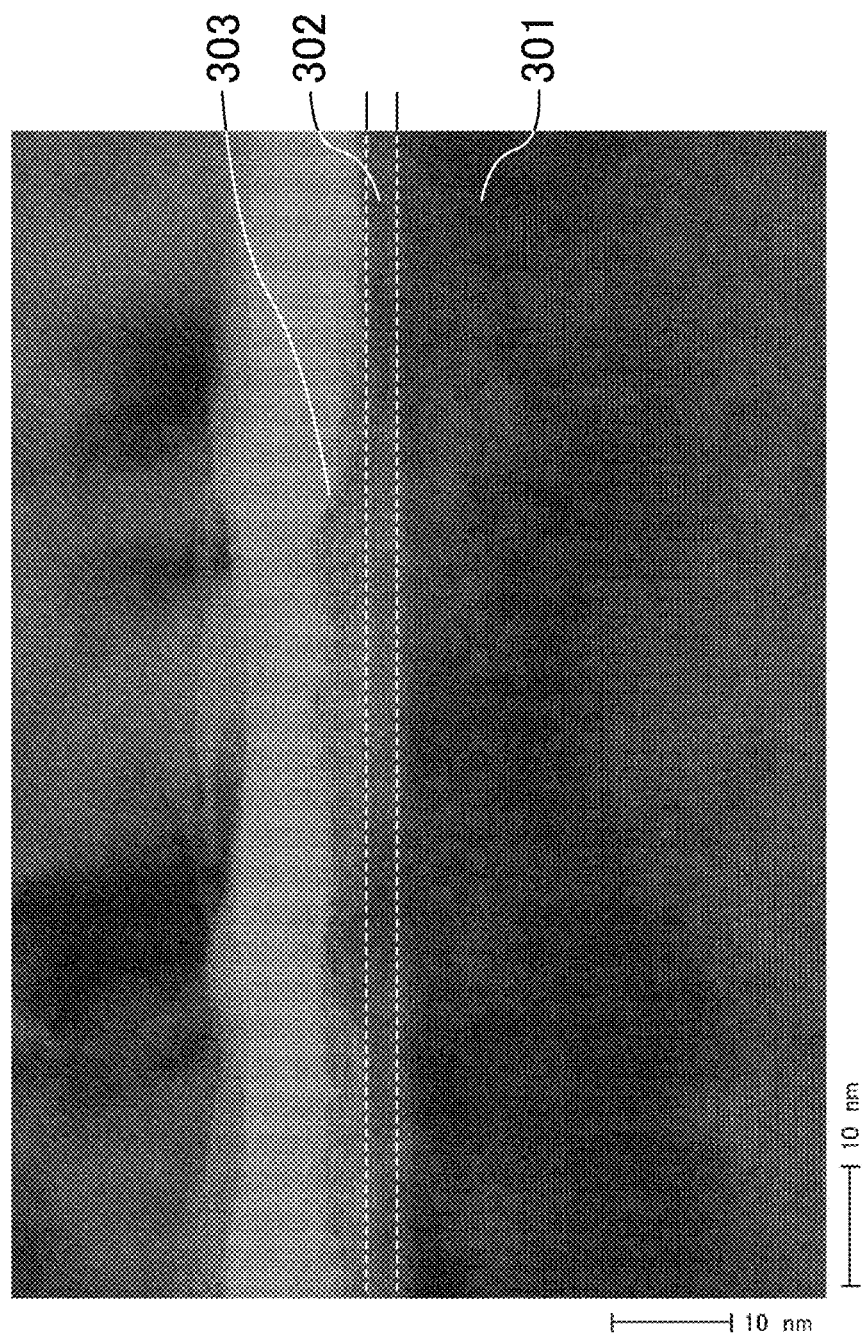
FIG. 5B is a photograph showing the observation result with the transmission electron microscope (TEM) in a region A of FIG. 5A.
Figure 5C:
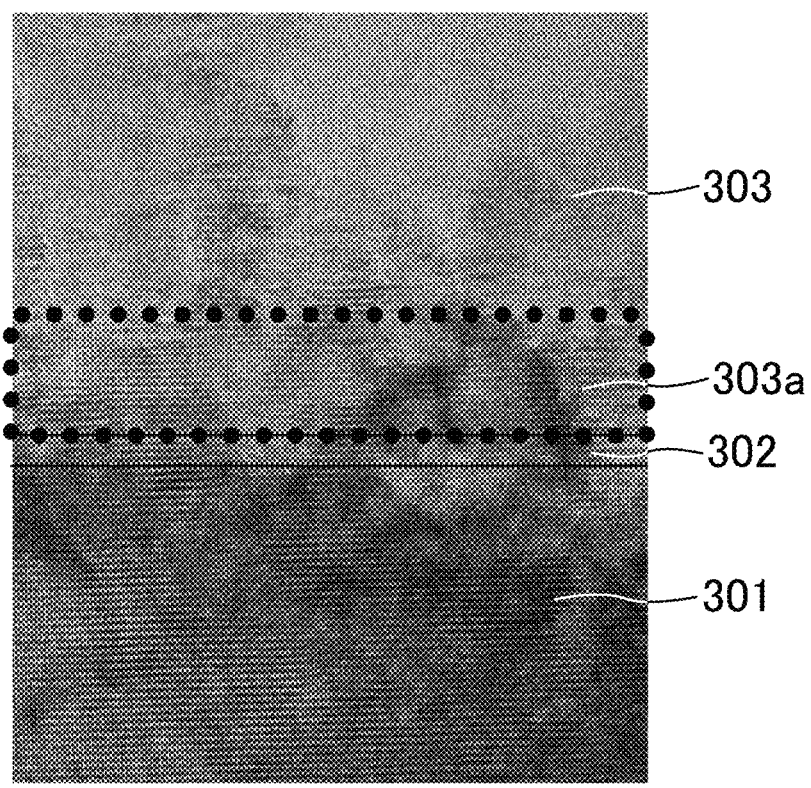
FIG. 5C is a photograph showing the observation result with the transmission electron microscope (TEM) in a region B of FIG. 5A.

As shown in FIG. 5A, the sample F has a region A, which is part of the low-temperature AlN layer 303. In the region A, wet etching for selectively etching the polycrystal portion is performed with an alkaline solution to facilitate the TEM observation. A surface protective layer 304 is then formed on the etched portion. On the other hand, a region B is the region not subjected to the wet etching. FIGS. 5B and 5C illustrate the result of the TEM observation of the regions A and B of FIG. 5A, respectively.

It is found from FIG. 5B that a portion of the low-temperature AlN layer 303 having resistance to etching with the alkaline solution remains on the spacer layer 302. Since the spacer layer 302 has a thickness of 2 nm, it is found that the low-temperature AlN layer takes over the crystal structure of the underlying layer to be single-crystallized. In the low-temperature AlN layer 303, the single crystal AlN is formed non-uniformly in the thickness direction wholly or insularly on the interface with the barrier layer.

On the other hand, it is found from FIG. 5C, single crystal AlN 303a is formed near the spacer layer 302, while polycrystal or amorphous AlN is formed in a region apart from the spacer layer 302.

Figure 6:
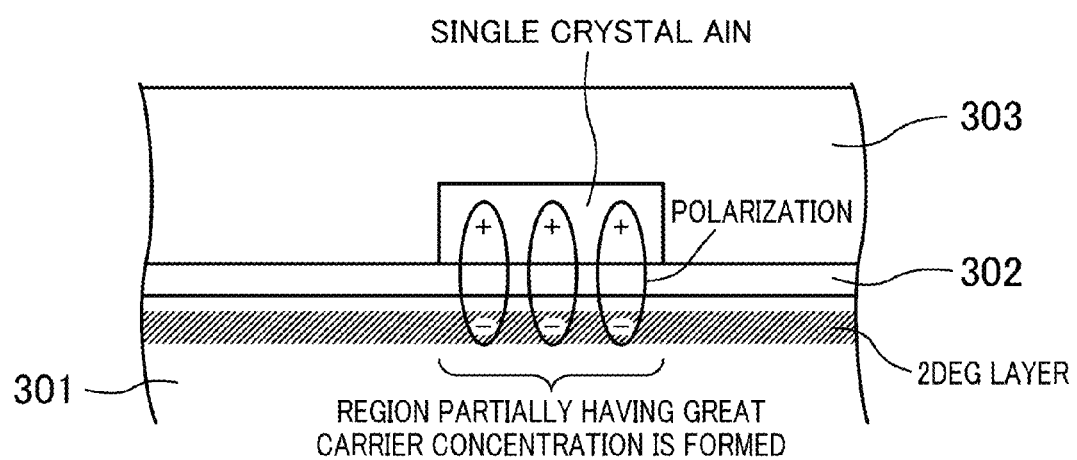
FIG. 6 is a schematic cross-sectional view illustrating the characteristics of single crystal AlN in the low-temperature AlN layer of the semiconductor device according to the first embodiment.

As described above, it is found from the results shown in FIGS. 3-5C, the sheet carrier concentration is more than $1 \times 10^{13}$ cm$^{-2}$ in the samples A-C, E, and F. Review of the result will be described with reference to FIG. 6.

According to FIG. 5B, the single crystal AlN is formed non-uniformly in the thickness direction wholly or insularly on a part of the surface of the spacer layer 302. A difference in the spontaneous polarization between the single crystal AlN including the spacer layer 302 and the GaN layer 301, or the strain due to the lattice mismatch causes piezoelectric polarization, which induces charges (polarization represented by positive and negative signs (+ and −) in FIG. 6). Out of them, the negative charges are distributed like a sheet as a two-dimensional electron gas (2DEG) layer near the interface in the GaN layer 301 between the spacer layer 302 and the GaN layer 301. These charges distributed like the sheet contribute to the sheet carrier concentration. In the sample D, a possible reason for the low sheet carrier concentration follows. Where the crystal growth temperature is 600° C. and the spacer layer 302 is not provided, the insular single crystal AlN is not formed, or a single crystal AlN is formed non-uniformly on the surface to cause little polarization on average, thereby inducing no charge.

Where the crystal growth temperature of the low-temperature AlN layer 303 is 900° C., the decrease in the sheet carrier concentration with the increasing thickness of the low-temperature AlN layer 303 may be attributed to the crack occurring in the low-temperature AlN layer 303. On the other hand, where the crystal growth temperature of the low-temperature AlN layer 303 is 600° C., the increase in the sheet carrier concentration with the increasing thickness of the low-temperature AlN layer 303 may be attributed to no crack occurring in the low-temperature AlN layer 303. The critical thickness of the single crystal AlN is about 7 nm. However, when polycrystal or amorphous AlN is mixed to single crystal AlN, the thickness causing a crack changes to increase the film formation temperature, thereby accelerating the crystallization. Therefore, the crack occurred in the high-temperature sample C (900° C., 40 nm), while no crack occurred in the low-temperature sample F (600° C., 40 nm), thereby increasing the carrier density.

As another possibility, the AlN cap layer 105 (the low-temperature AlN layer 303) at the initial formation stage may be crystallized to contribute to the increase in the carriers. Where the crystal growth temperature is 600° C., an increase in the thickness tends to increase the sheet carrier concentration. Thus, the passivation effect, etc. at the surface of the SiN film, etc. may contribute to an increase in the carriers.

In this embodiment, AlN containing a mixture of single crystals and polycrystals is formed by crystal growth at a crystal growth temperature ranging from 600° C. to 900° C., both inclusive, and partially contains single crystals. The sheet carrier concentration at the interface with the GaN layer is increased by using this AlN layer containing the mixture of single crystals and polycrystals.

Similar to the above-described AlN, the group III nitride semiconductor containing a mixture of single crystals and polycrystals is group III nitride semiconductor, which is formed at a lower crystal growth temperature than usual, and partially contains single crystal group III nitride semiconductor. Similar to the AlN layer containing the mixture of single crystals and polycrystals, the group III nitride semiconductor containing the mixture of single crystals and polycrystals increases the sheet carrier concentration at the heterojunction interface.

1D. Carrier Concentration of Carrier Traveling Layer 103

Figure 7:
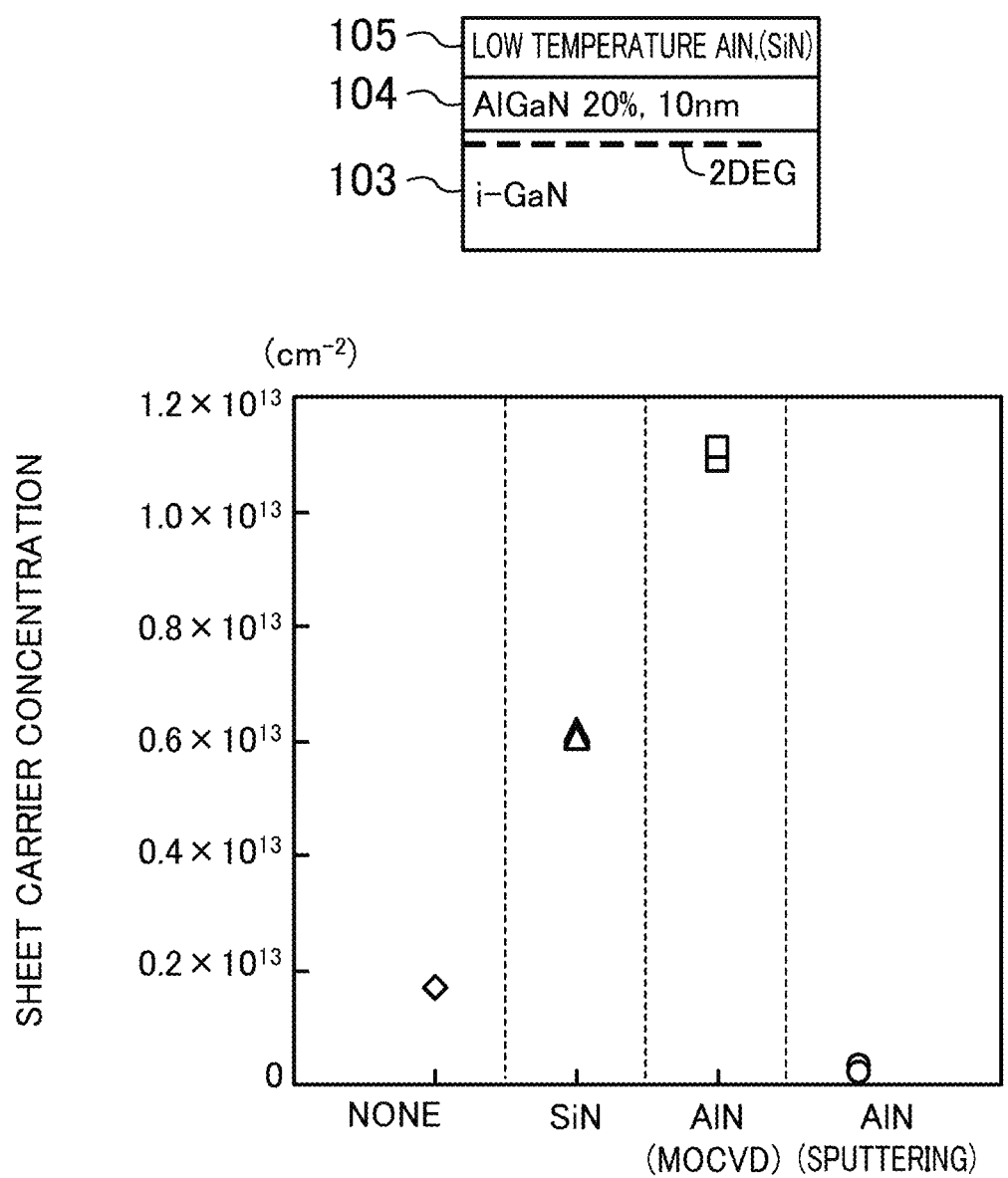
FIG. 7 is a graph showing the relation between the sheet carrier concentration and presence or absence of a cap layer, the composition and the formation method of the cap layer in the semiconductor device according to the first embodiment.

FIG. 7 illustrates the relation between the cap layer 105 and the carrier concentration of the 2DEG layer generated in the carrier traveling layer 103 where the multilayer is formed by stacking the carrier traveling layer 103, the barrier layer 104, and the cap layer 105. The carrier traveling layer 103 is made of GaN. The barrier layer 104 is formed on the carrier traveling layer 103, has a thickness of 10 nm, and is made of $Al_{0.2}Ga_{0.8}N$. The cap layer 105 is made of AlN containing a mixture of single crystals and polycrystals, and has a thickness of 20 nm. As comparison, the graph shows carrier concentrations where the cap layer 105 is not provided on the barrier layer 104, where an SiN film (with a thickness of 100 nm), which is usually used as a passivation film, is provided as the cap layer 105, and where the AlN cap layer is formed by another method. In this study, the FET does not include the passivation film 109.

As clear from FIG. 7, where the cap layer 105 is not provided, the carrier concentration of the 2DEG layer is as small as $0.2 \times 10^{13}$ cm$^{-2}$.

Where the SiN film is provided as the cap layer 105, the SiN film passivates (i.e., inactivates) the surface of the barrier layer 104 to reduce depletion of the surface of the barrier layer 104. As a result, the carrier concentration of the 2DEG layer increases to $0.6 \times 10^{13}$ cm$^{-2}$.

By contrast, in the present disclosure, the barrier layer 104 is provided on the AlN cap layer 105, which is formed at the low temperature of 600° C. and contains the mixture of single crystals and polycrystals. In this case, it is clear that the carrier concentration of the SiN film.

As shown in FIG. 7, where the AlN cap layer 105 is formed by sputtering, little carrier occurred in the 2DEG layer. That is, it is found that the AlN formed by sputtering does not cause carriers, different from the AlN of the present disclosure.

As such, carriers are caused by the AlN of the present disclosure, which contains the mixture of single crystals and polycrystals, and is formed by MOCVD.

1E. Comparison of Electrical Characteristics between FET of Present Disclosure and Conventional FET A result of comparison of the electrical characteristics between the FET of the present disclosure shown in FIG. 1 and a conventional FET using SiN for a passivation film. In the conventional FET, the SiN passivation film 109 is directly formed on the barrier layer 104. That is, no cap layer 105 is provided. The layer structure between the substrate 101 and the barrier layer 104 is the same as that of the FET of the present disclosure.

Figure 8:
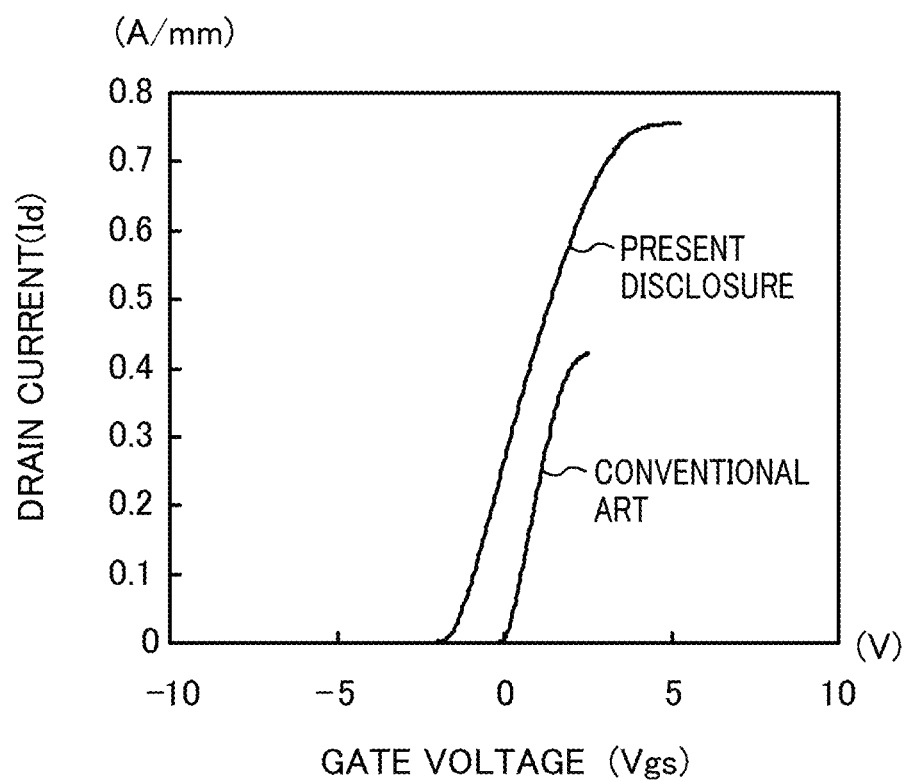
FIG. 8 is a graph illustrating current-voltage characteristics of the semiconductor device according to the first embodiment in comparison to a conventional semiconductor device.

FIG. 8 illustrates the relation between gate-source voltages Vgs and drain currents Id of the FET of the present disclosure and the conventional FET. The source electrodes are grounded, and use bias voltages applied to the gate electrodes as a parameter. That is, the gate-source voltages Vgs are applied to the gate electrodes.

According to the result shown in FIG. 8, as compared to the conventional FET, the drain current Id of the FET of the present disclosure increases with the increasing value of the gate-source voltage Vgs. A possible cause is considered as follows from the results shown in FIGS. 3-5. As compared to the conventional FET, in the FET of the present disclosure, a high concentration of DEG is generated at the interface between the barrier layer 104 and the carrier traveling layer 103 to reduce the resistance of the region in which electrons travel, i.e., the channel resistance.

As such, it is found that the FET of the present disclosure has excellent electrical characteristics as compared to the conventional FET.

1F. Characteristic Change in FET of Present Disclosure Depending on Thickness of Barrier Layer 104

Figure 9A:
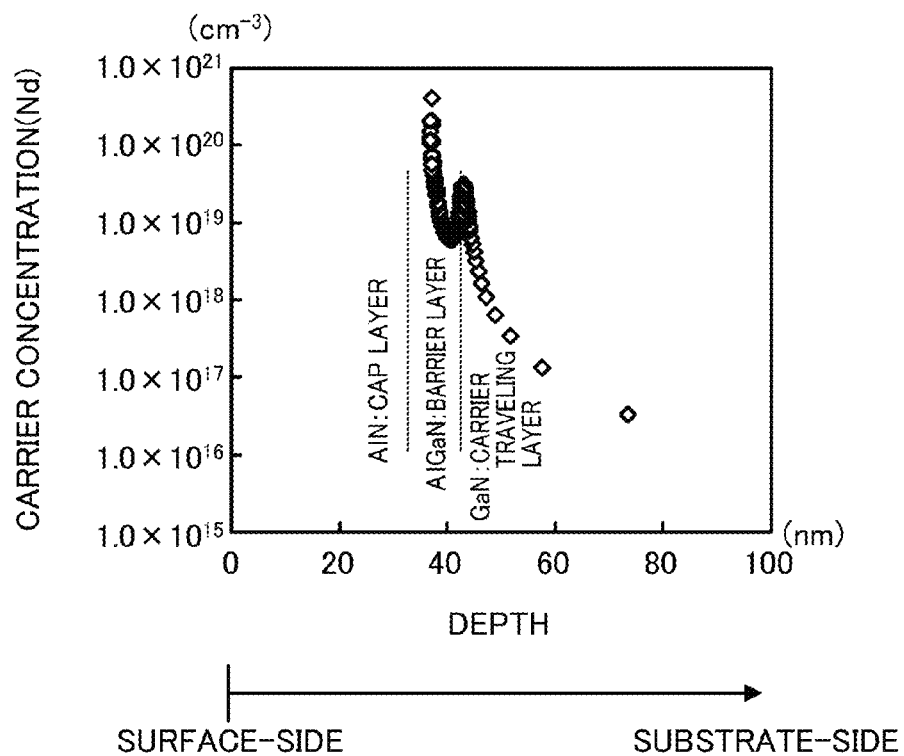
FIGS. 9A and 9B are graphs illustrating the distribution of the carrier concentration in the semiconductor device according to the first embodiment where the barrier layer is thick and thin, respectively.
Figure 9B:
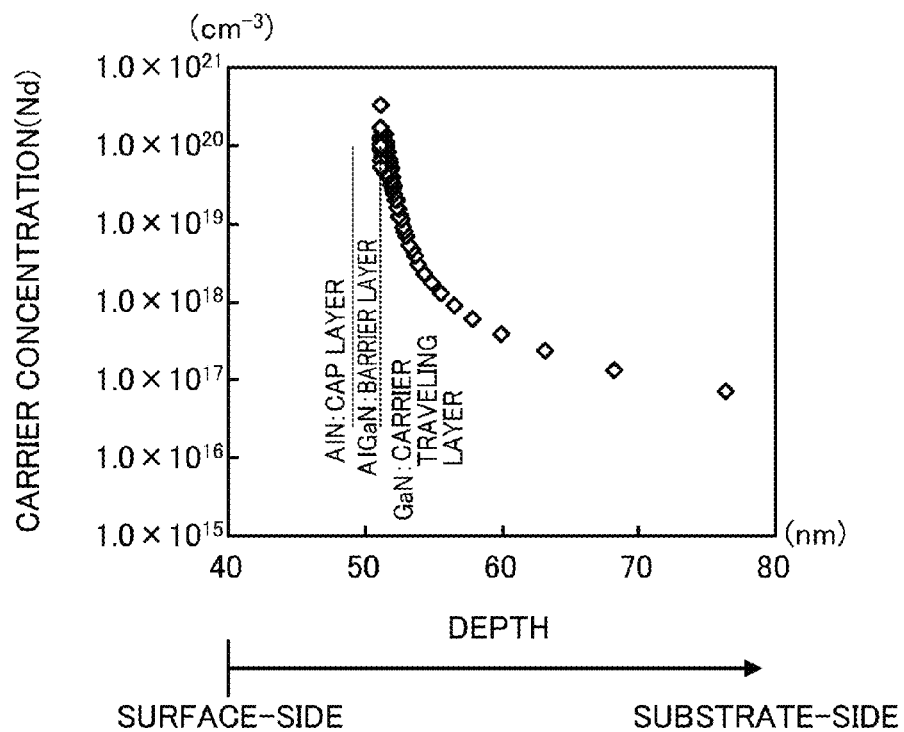

The inventor studied the FET of the present disclosure as to how the concentration of the carriers generated at the interface between the barrier layer 104 and the carrier traveling layer 103 changes with a change in the thickness of the barrier layer 104. FIGS. 9A and 9B show the result.

In FIGS. 9A and 9B, carrier distribution is measured using the outermost of the cap layer 105 as the surface (i.e., the origin), and using the direction toward the substrate is a depth direction. The generated carriers are donors.

The studied barrier layer 104 has a thickness of 10 nm in FIG. 9A, and 2 nm in FIG. 9B.

As shown in FIG. 9A, where the barrier layer 104 has the thickness of 10 nm, the carrier concentration Nd at the interface between the barrier layer 104 and the carrier traveling layer 103 is in the $10^{19}$ cm$^{-3}$-range. On the other hand, as shown in FIG. 9B, where the barrier layer 104 has the thickness of 2 nm, the carrier concentration Nd is in the $10^{20}$ cm$^{-3}$-range. That is, the carrier concentration is higher than that of the barrier layer 104 with the thickness of 10 nm by about one digit. A possible cause is as follows. The single crystal AlN of the AlN cap layer 105 comes close to the interface between the barrier layer 104 and the carrier traveling layer 103, and more polarization charges are generated by the single crystal AlN at the interface between the barrier layer 104 and the carrier traveling layer 103. In FIG. 9A, many carriers exist at the interface between the cap layer 105 and the barrier layer 104. Since the cap layer 105 does not have a uniform thickness, the crystal lattice partially randomly arranged and a fluctuation in the potential causes scattering to reduce mobility. Therefore, even when the total numbers of carriers are equal in FIGS. 9A and 9B, the configuration of FIG. 9B is excellent for reducing the sheet resistance.

1G. Passivation Film 109 in FET of this Embodiment

In the FET according to this embodiment, the surface of the AlN forming the cap layer 105 is protected by a SiN passivation film, thereby inactivating the surface of the AlN. This improves the device characteristics. For example, the amount of current increases, and a current collapse phenomenon decreases.

In the FET according to this embodiment, the passivation film may be a silicon dioxide ($SiO_2$) film, an aluminum oxide ($Al_2O_3$) film, etc., instead of the SiN film.

1H. FET of Variation of First Embodiment

Figure 10:
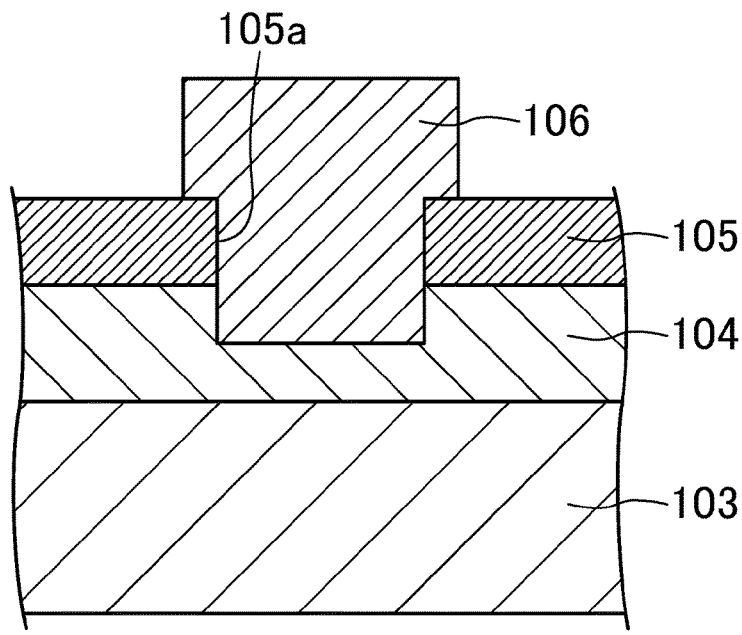
FIG. 10 is an enlarged schematic cross-sectional view of the vicinity of a gate electrode in a semiconductor device according to a variation of the first embodiment.

FIG. 10 illustrates an enlarged cross-sectional structure of the vicinity of a gate electrode in a FET according to a variation of the first embodiment.

As shown in FIG. 10, the FET according to the variation is formed by reducing the thickness of the barrier layer 104 in the FET of FIG. 1 at the portion directly under the gate electrode 106, and forming the gate electrode 106 on the portion. As such, the thickness of the barrier layer 104 at the portion directly under the gate electrode 106 is reduced, thereby increasing the controllability by the gate electrode 106. In addition, the threshold voltage in the FET is determined by adjusting the thickness of the barrier layer 104 at the portion directly under the gate electrode 106.

Second Embodiment

A FET according to a second embodiment of the present disclosure will be described below with reference to FIG. 11.

Figure 11:
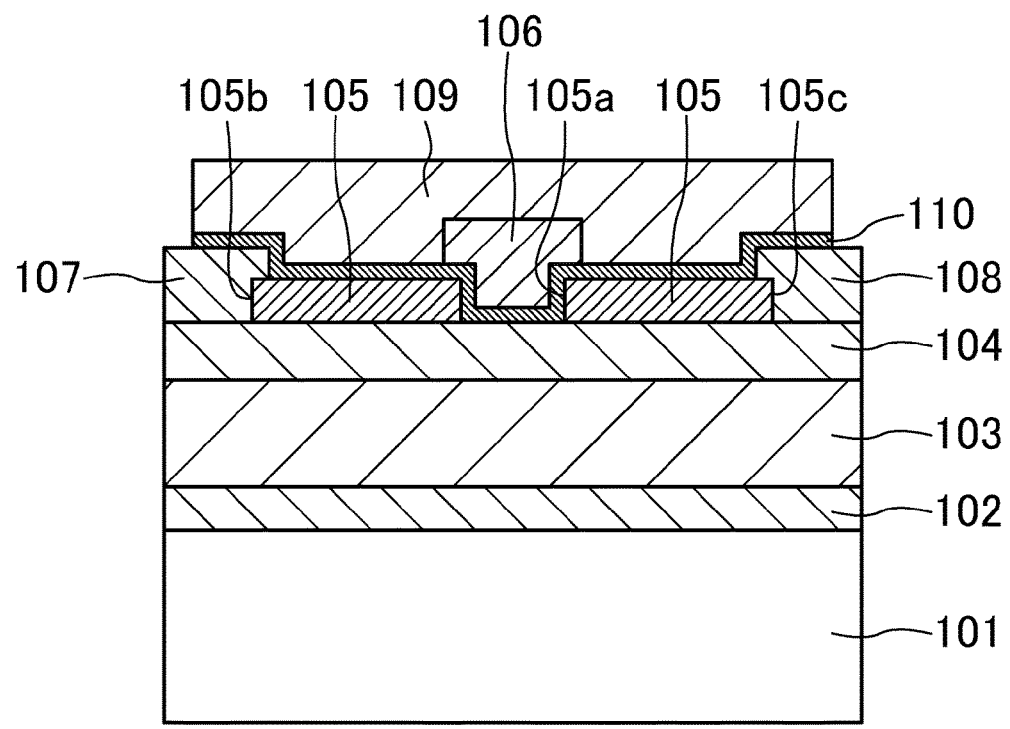
FIG. 11 is a schematic cross-sectional view illustrating a semiconductor device according to a second embodiment of the present disclosure.

In FIG. 11, the same reference characters as those shown in the first embodiment are used to represent equivalent elements, and the explanation thereof will be omitted. It is also applicable to the subsequent embodiments.

As shown in FIG. 11, different from the FET according to the first embodiment, the FET according to the second embodiment includes an insulating layer 110, which has, for example, a thickness of 10 nm and is made of aluminum oxide ($Al_2O_3$), between a cap layer 105 and a gate electrode 106. The insulating layer 110 is interposed between a barrier layer 104 and the gate electrode 106. The insulating layer 110 may be formed, for example, by atomic layer deposition.

In the FET according to the second embodiment, a high gate voltage can be applied to the positive side, as compared to a Schottky gate FET, in which a gate current flows at a forward voltage of about 1V. Therefore, the structure is preferable as a gate structure of a FET having normally-off characteristics.

The insulating layer 110 may be made of an insulating material such as hafnium dioxide ($HfO_2$), silicon dioxide ($SiO_2$), or silicon nitride (SiN) instead of $Al_2O_3$. The thickness of the insulating layer 110 is not limited to 10 nm, and may be determined as appropriate in accordance with the device characteristics and required specifications.

In this embodiment, as shown in FIG. 11, the insulating layer 110 is provided across the tops of the cap layer 105 and the barrier layer 104.

Figure 12A:
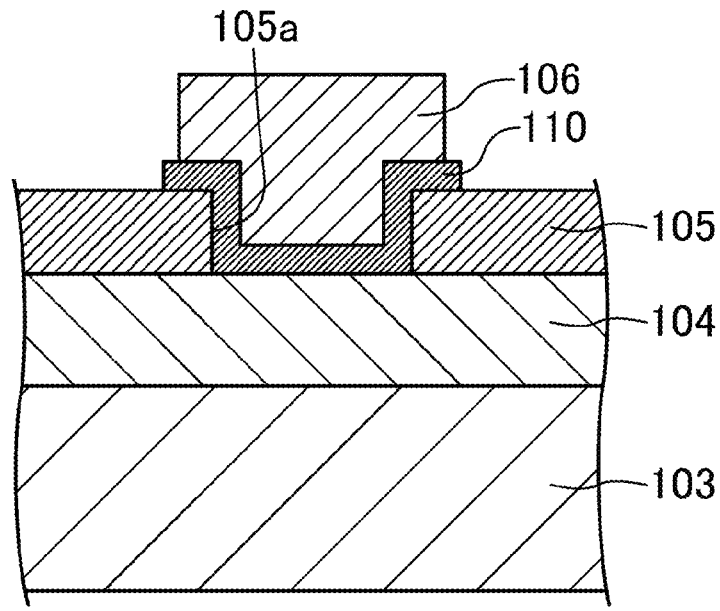
FIG. 12A is an enlarged schematic cross-sectional view illustrating the vicinity of a gate electrode in a semiconductor device according to a first variation of the second embodiment.

As a first variation, as shown in FIG. 12A, the insulating layer 110 may be provided under the gate electrode 106 only.

Figure 12B:
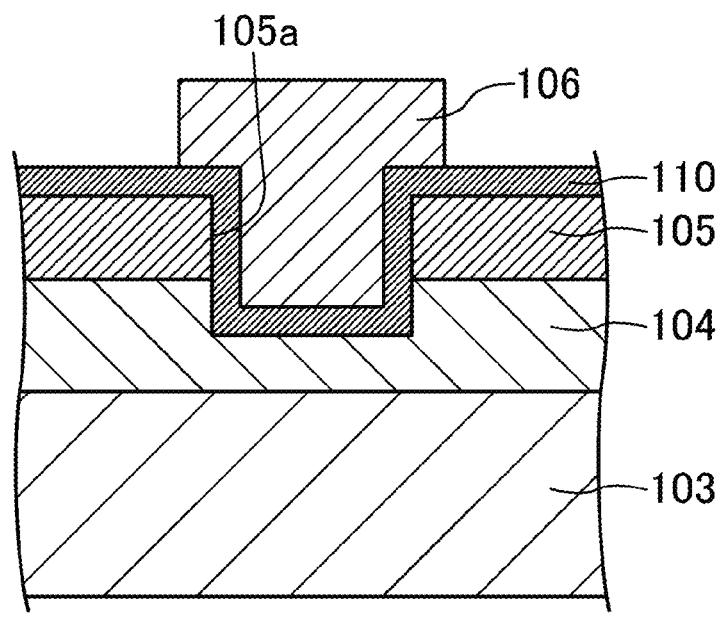
FIG. 12B is an enlarged schematic cross-sectional view illustrating the vicinity of a gate electrode in a semiconductor device according to a second variation of the second embodiment.

As a second variation, as shown in FIG. 12B, the thickness of the barrier layer 104 at the portion directly under the gate electrode 106 may be reduced to provide the insulating layer 110. That is, in the barrier layer 104, the thickness under the gate electrode 106 is smaller than the thickness on the sides of the gate electrode 106.

As shown in FIG. 11, the surface of the AlN forming the cap layer 105 is protected by a SiN passivation film 109, thereby inactivating the surface of the AlN to further improve the device characteristics.

In the FET according to this embodiment as well, the passivation film 109 may be made of $SiO_2$, etc., instead of SiN.

Figure 12C:
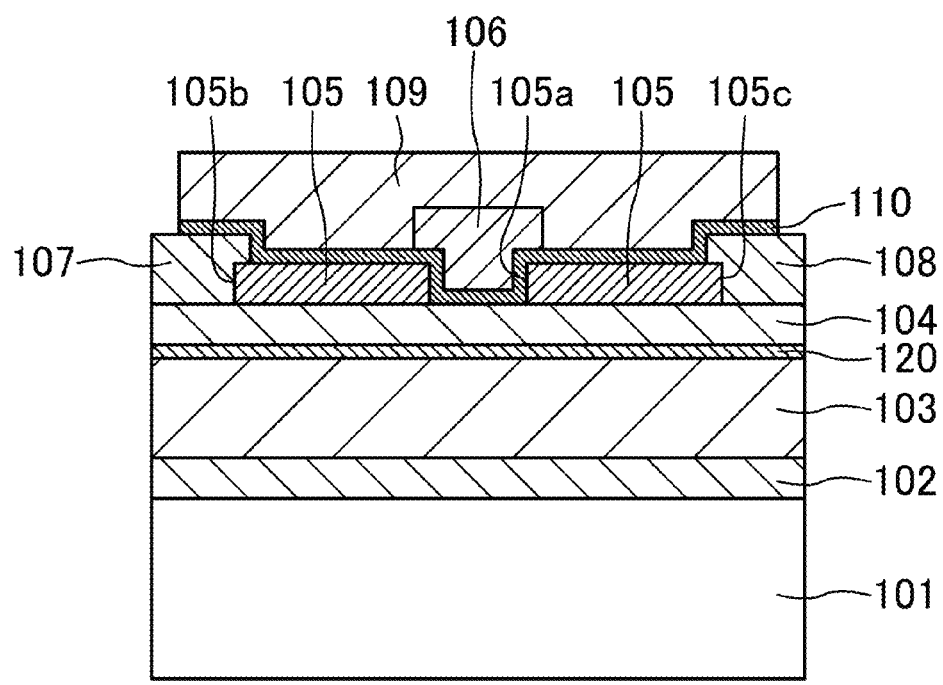
FIG. 12C is a schematic cross-sectional view illustrating a semiconductor device according to a third variation of the second embodiment.

As a third variation, as shown in FIG. 12C, a spacer layer 120 made of AlN may be provided between the barrier layer 104 and the carrier traveling layer 103. In this case, the spacer layer 120 is preferably made of single crystal AlN. This configuration reduces alloy scattering, thereby increasing the carrier mobility.

Third Embodiment

A FET according to a third embodiment of the present disclosure will be described below with reference to FIG. 13.

Figure 13:
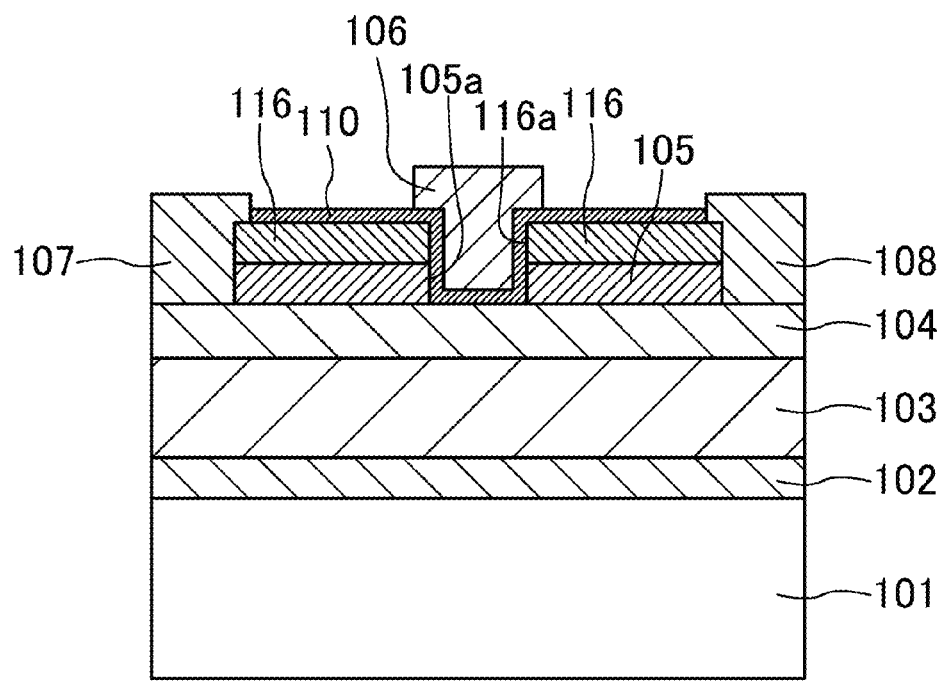
FIG. 13 is a schematic cross-sectional view illustrating a semiconductor device according to a third embodiment of the present disclosure.

As shown in FIG. 13, the FET according to the third embodiment includes a protective film 116 formed on a cap layer 105, and made of silicon nitride (SiN) or silicon dioxide ($SiO_2$).

The protective film 116 is patterned to have the same openings as the underlying cap layer 105. In each opening, a source electrode 107 and a drain electrode 108 are formed. A gate electrode 106 is formed on a barrier layer 104 with an insulating layer 110 interposed therebetween.

An example method of manufacturing the FET according to the third embodiment with the above-described structure will be described below with reference to FIGS. 14A-14E.

Figure 14D:
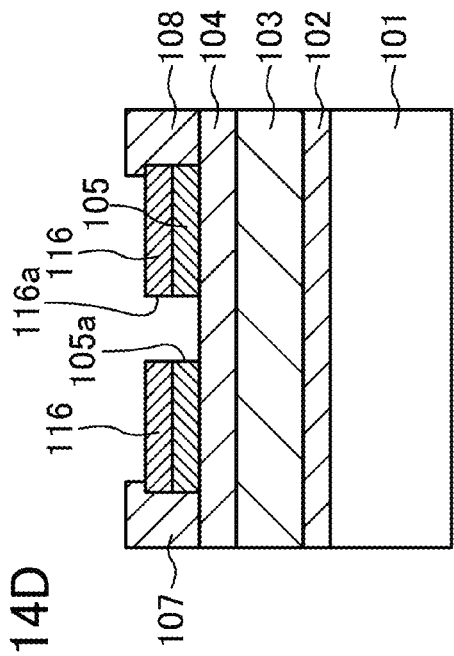
FIGS. 14A-14E are cross-sectional views illustrating a method of the semiconductor device according to the third embodiment in order of steps.
Figure 14E:
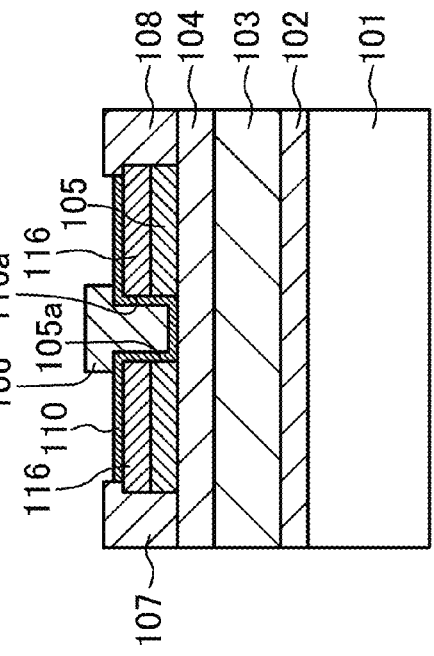
Figure 14A:
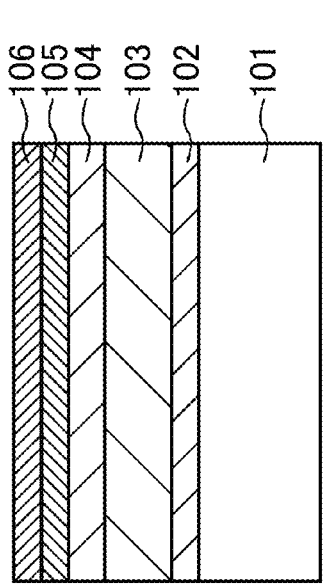

First, as shown in FIG. 14A, similar to the first embodiment, the cap layer 105 is formed on the barrier layer 104. Then, the protective film 116, which has a thickness ranging from about 50 nm to about 200 nm and is made of SiN, $SiO_2$, etc., is formed on the cap layer 105 by chemical vapor deposition (CVD), etc.

Figure 14B:
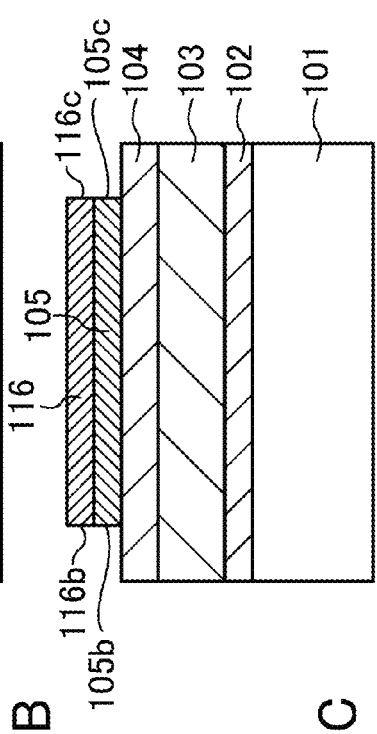

Next, as shown in FIG. 14B, a resist pattern having an opening pattern exposing the regions for forming the source electrode and the drain electrode is formed on the protective film 116. Then, the protective film 116 is dry etched using the formed resist pattern as a mask. As a result, a second opening 116b and a third opening 116c are formed in the protective film 116. Next, the cap layer 105 is etched with an alkaline developer using the resist pattern and the patterned protective film 116 as a mask. After that, the resist pattern is removed. As a result, a second opening 105b and a third opening 105c are also formed in the cap layer 105. The protective film 116 may be wet etched, although the dry etching has higher controllability of the pattern size than the wet etching. The resist pattern may be removed before etching the cap layer 105.

Figure 14C:
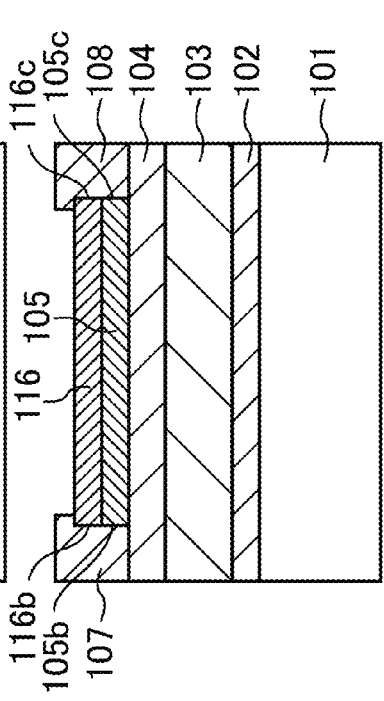

Then, as shown in FIG. 14C, the source electrode 107 and the drain electrode 108 are formed in the second openings 105b and 116b, and the third openings 105c and 116c. After that, the electrodes 107 and 108 are subjected to heat treatment to obtain ohmic characteristics.

Next, as shown in FIG. 14D, a resist pattern having an opening pattern exposing the region for forming the gate electrode is formed on the protective film 116. Then, the protective film 116 is dry etched using the formed resist pattern as a mask. As a result, a first opening 116a is formed in the protective film 116. Next, the cap layer 105 is etched with an alkaline developer using the resist pattern and the patterned protective film 116 as a mask. After that, the resist pattern is removed. As a result, a first opening 105a is formed in the cap layer 105. The protective film 116 may be wet etched. The resist pattern may be removed before etching the cap layer 105.

After that, as shown in FIG. 14E, the insulating layer 110 is formed on the cap layer 105 to cover the walls and the bottoms of the first openings 105a and 116a. Then, the gate electrode 106 is selectively formed on the insulating layer 110 to fill the first openings 105a and 116a.

The protective film 116 according to the third embodiment may be, as described above, an insulating film made of SiN, $SiO_2$, etc. Furthermore, the protective film 116 is not limited to the insulating film, but may be made of metal, as long as it functions as a mask in etching the cap layer 105. Alternatively, it may be made of a material such as silicon nitride (SiN) or aluminum oxide ($Al_2O_3$), which functions as the passivation film for the cap layer 105. Therefore, in this point of view, the protective film 116 may be a crystal or amorphous SiN film, which can be formed continuously within the same film formation device as the cap layer 105. Alternatively, after the first to third openings of the cap layer 105 are formed, the protective film 116 may be removed with chemical solution such as hydrofluoric acid (HF) etc., to form the device structure of the first embodiment. Alternatively, no insulating layer 110 is formed and the gate electrode 106 is formed directly on the barrier layer 104 to form a Schottky gate device structure.

Manufacturing Method of Variation of Third Embodiment

FIG. 15 illustrates a method of manufacturing a FET according to a variation of the third embodiment.

Figure 15A:
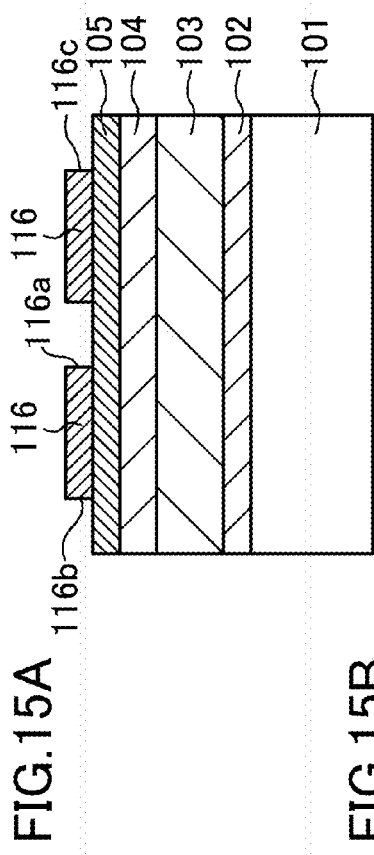
FIGS. 15A-15E are cross-sectional views illustrating a variation of the method of the semiconductor device according to the third embodiment in order of steps.

In this variation, as shown in FIG. 15A, in the formation of the protective film, the protective film 116, in which the openings 116a, 116b, and 116c are formed in advance, is formed in the regions for forming the gate electrode, the source electrode, and the drain electrode. The protective film 116 may be formed, for example, by vacuum vapor deposition using a resist pattern in a desired shape. The film may be made of Ti, Au, etc.

Figure 15B:
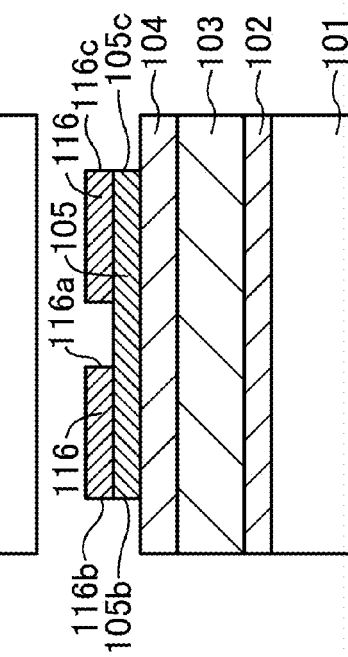
Figure 15C:
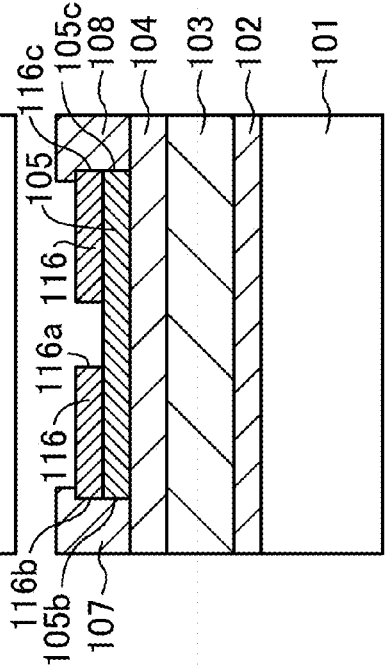

Then, as shown in FIGS. 15B and 15C, the second opening 105b and the third opening 105c are formed in the cap layer 105. After that, the source electrode 107 and the drain electrode 108 are formed. Then, the electrodes 107 and 108 are subjected to heat treatment to obtain ohmic characteristics.

Figure 15D:
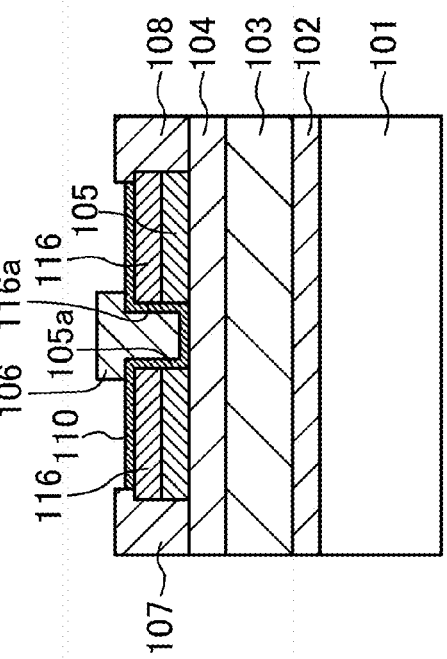
Figure 15E:
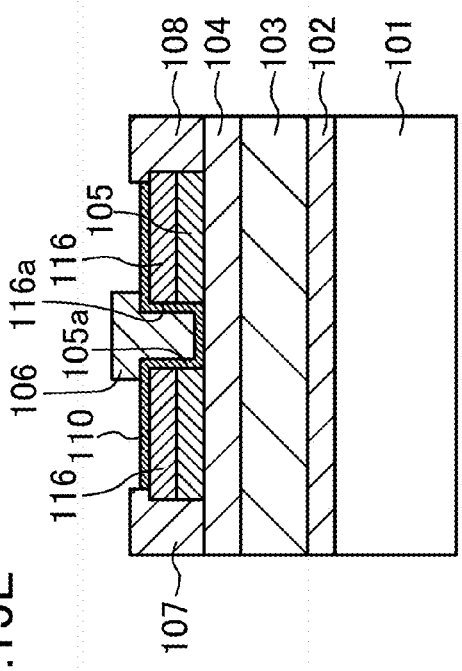

Next, as shown in FIGS. 15D and 15E, the first opening 105a is formed in the cap layer 105. After that, the insulating layer 110 and the gate electrode 106 are sequentially formed.

In the FET according to the third embodiment as well, a SiN film or a SiO$_2$ film, etc., may be provided as a passivation film to cover the gate electrode 106, the source electrode 107, the drain electrode 108, and the protective film 116.

Fourth Embodiment

Figure 16:
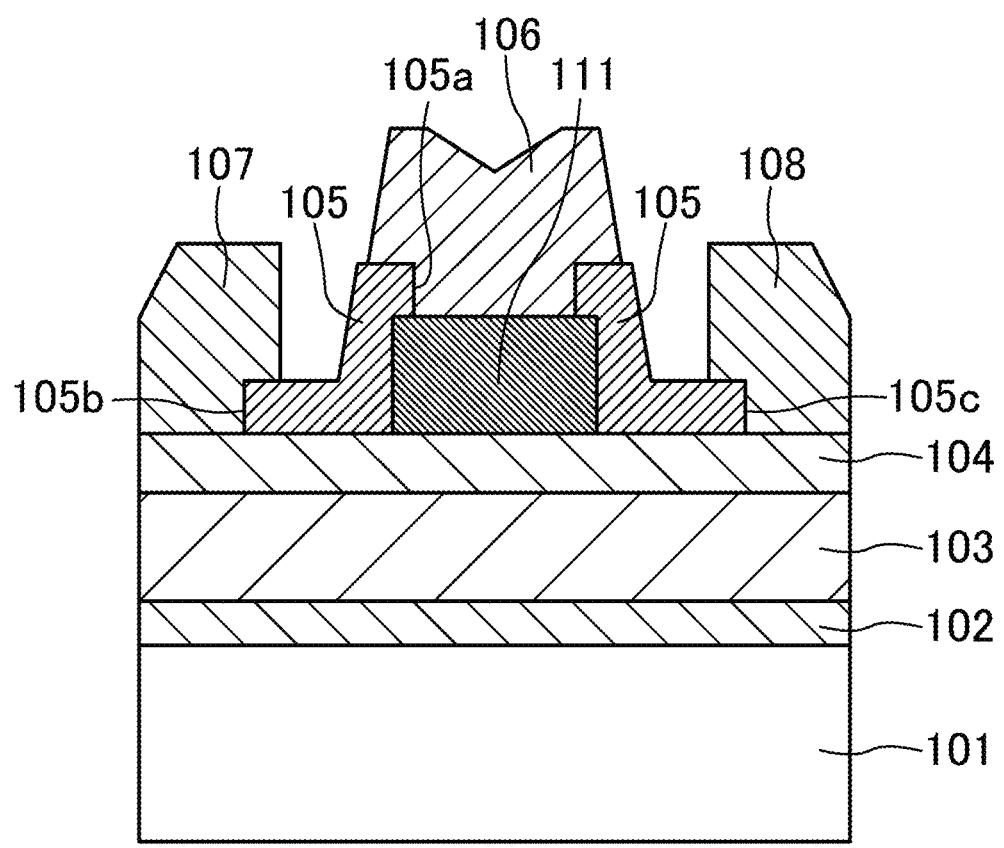
FIG. 16 is a schematic cross-sectional view illustrating a semiconductor device according to a fourth embodiment of the present disclosure.

A FET according to a fourth embodiment of the present disclosure will be described below with reference to FIG. 16.
4A. Device Structure As shown in FIG. 16, the FET according to the fourth embodiment is formed by sequentially stacking a buffer layer 102, a carrier traveling layer 103, and a barrier layer 104, which are made of group III nitride semiconductor, on the principal surface of a substrate 101, whose plane orientation is the (111) plane.

A gate control layer 111 made of p-type group III nitride semiconductor, for example, $Al_xGa_{1-x}N$, where 0≤x≤1, is formed on the barrier layer 104 in a region for forming a gate electrode.

A feature of this embodiment is that a cap layer 105, which is made of group III nitride semiconductor containing a mixture of single crystals and polycrystals, is formed to cover the barrier layer 104, and the side surfaces and part of the upper surface of the gate control layer 111. The group III nitride semiconductor in this embodiment is $Al_zGa_{1-z}N$, where 0≤z≤1. The following Table 4 shows example compositions and thicknesses of the layers from the buffer layer 102 to the cap layer 105, and the gate control layer 111.

TABLE 4

|  | Al Composition | Thickness (nm) |
|---|---|---|
| Carrier Traveling Layer 103 | 0 | 1000 |
| Barrier Layer 104 | 0.2 | 10 |
| Gate Control Layer 111 | 0 | 200 |
| Cap Layer 105 | 1 | 40 |

The group III nitride semiconductor containing the mixture of single crystals and polycrystals is as described in the first embodiment.

A gate electrode 106 for bias application is formed above the gate control layer 111 through a first opening 105a provided in the cap layer 105.

On the both sides of the gate electrode 106 on the barrier layer 104, a source electrode 107 and a drain electrode 108 for bias application are formed through a second opening 105b and a third opening 105c, respectively. The openings 105b and 15c are formed in the cap layer 105.

4B. Manufacturing Method

An example method of manufacturing the semiconductor device according to the fourth embodiment having the above-described features will be described below with reference to FIGS. 17A-18B.

Figure 17A:
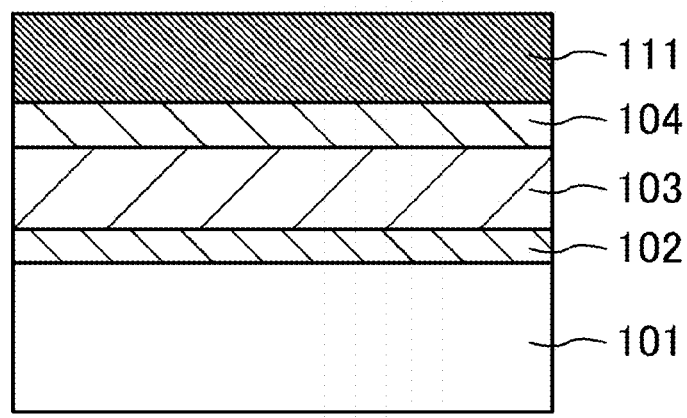
FIGS. 17A-17C are cross-sectional views illustrating a method of the semiconductor device according to the fourth embodiment in order of steps.
Figure 17B:
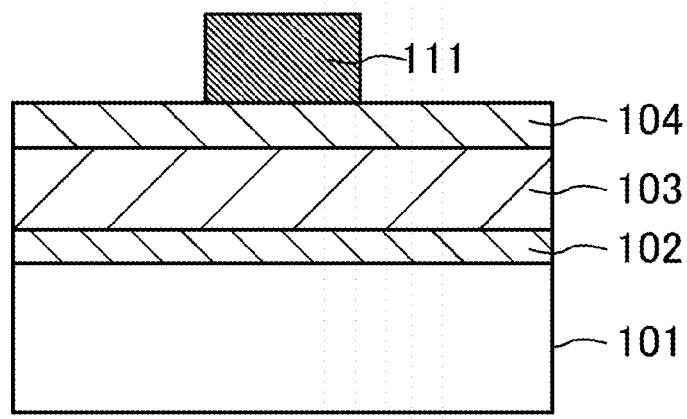
Figure 17C:
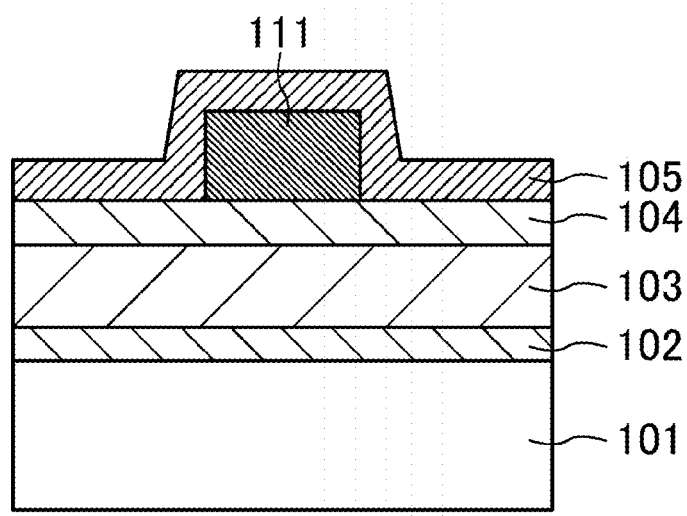

First, as shown in FIG. 17A, the buffer layer 102, the carrier traveling layer 103, the barrier layer 104, and the gate control layer 111 are sequentially epitaxially grown on the principal surface of the substrate 101 using a crystal growth device performing MOCVD. The buffer layer 102 has a thickness ranging from about 200 nm to about 3500 nm, and is a single layer of $Al_xGa_{1-x}N$, where 0<x≤1, or a multilayer of layers with different Al compositions. The carrier traveling layer 103 has a thickness of 1000 nm, and is made of GaN. The barrier layer 104 has a thickness of 10 nm, and is made of $Al_{0.2}Ga_{0.8}N$. The gate control layer 111 is doped with magnesium (Mg) to exhibit p-type conductivity. The gate control layer 111 has a thickness of 200 nm and is made of GaN. A multilayer of the plurality of group III nitride semiconductor layers is formed. Material gas is TMG, TMA, and NH$_3$. Gas containing Mg, which is the p-type dopant, is dicyclopentadienyl magnesium (Cp$_2$Mg).

Next, as shown in 17B, the gate control layer 111 is removed by lithography and dry etching to leave the region for forming the gate electrode. In this case, the etching is preferably stopped at the surface of the barrier layer 104. Part of the barrier layer 104 may be etched. However, if the barrier layer 104 is etched too much, a damage of the dry etching may raise the sheet resistance. After that, annealing is performed to activate Mg, which is the p-type dopant.

Then, as shown in 17C, the AlN cap layer 105 is formed at a growth temperature, which is lower than the growth temperature of the barrier layer 104 or the carrier traveling layer 103, for example, at 600° C., to cover the barrier layer 104 and the gate control layer 111. The AlN cap layer 105 contains the mixture of single crystals and polycrystals and has a thickness of 20 nm.

The crystal growth of the AlN cap layer 105 grown at the low temperature is performed under the conditions shown in the above-described Table 2.

Figure 18A:
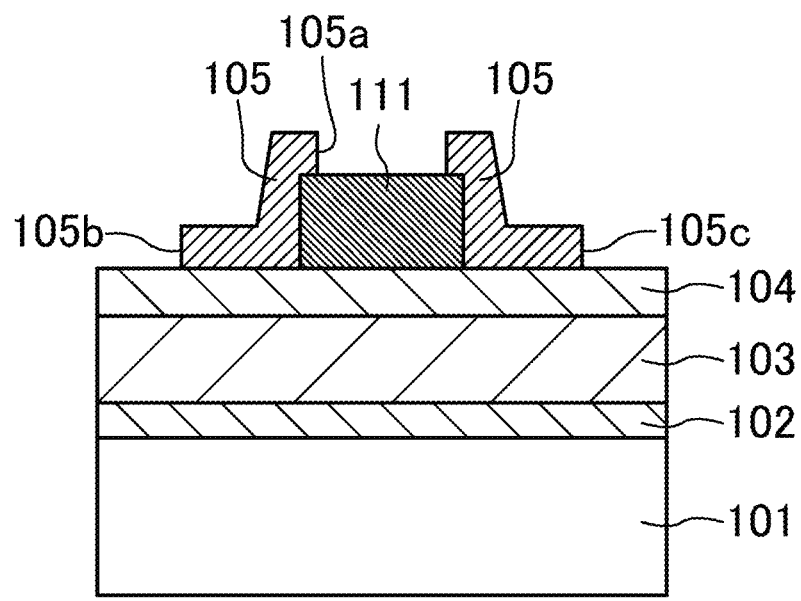
FIGS. 18A and 18B are cross-sectional views illustrating the method of the semiconductor device according to the fourth embodiment in order of steps.

After that, as shown in FIG. 18A, a resist pattern exposing the region for forming the gate electrode is formed on the cap layer 105. The cap layer 105 is wet etched using the formed resist pattern as a mask. As a result, the first opening 105a is formed in the cap layer 105. At this time, the cap layer 105 can be easily removed with an alkaline developer. Therefore, etching can be selectively and easily performed using a resist mask pattern, and using the crystal gate control layer 111 and the crystal barrier layer 104 as an etch stop layer. Similar to the first opening 105a, the second opening 105b and the third opening 105c are formed in the cap layer 105. These openings 105a, 105b, and 105c may be formed at the same time, or in the opposite order.

Figure 18B:
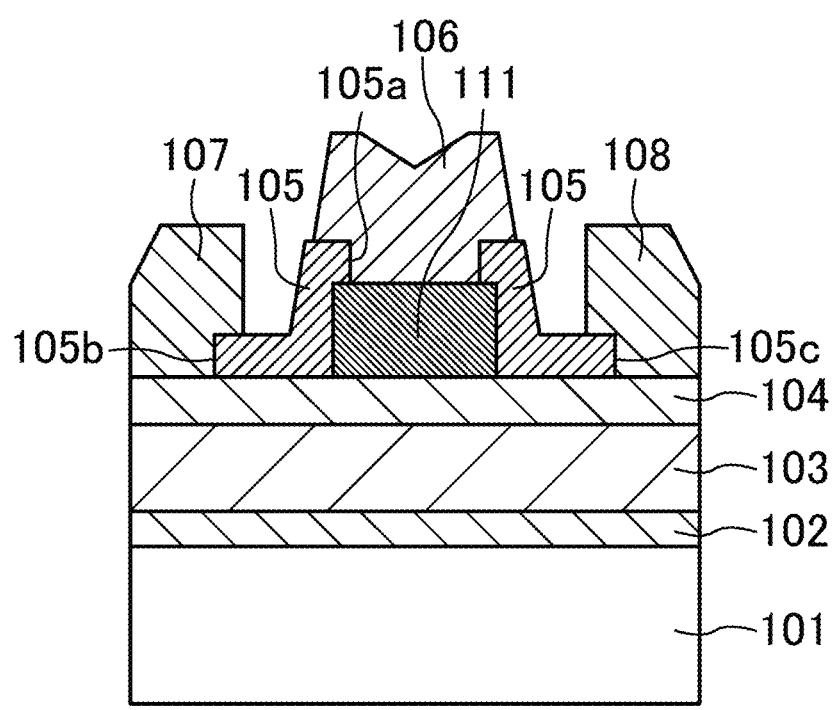

Next, as shown in FIG. 18B, with use of a mask pattern exposing the second opening 105b and the third opening 105c, the source electrode 107 and the drain electrode 108 are formed by sputtering, vacuum vapor deposition, etc. to fill the openings 105b and 105c, respectively. After that, the source electrode 107 and the drain electrode 108 are subjected to suitable heat treatment to form ohmic contacts. Similarly, the gate electrode 106 is formed by vacuum vapor deposition, etc., to fill the first opening 105a.
4C. Device Characteristics Operation characteristics of the FET according to the fourth embodiment will be described.

Similar to the FET according to the first embodiment, in the FET according to this embodiment, the MN cap layer 105 grown at the low temperature is provided on the barrier layer 104, thereby obtaining large drain current due to a predetermined source-gate voltage. In addition, the p-type the gate control layer 111 is provided between the gate electrode 106 and the barrier layer 104, thereby easily providing a normally off (enhancement) FET.

4D. First Variation

FIGS. 19A-20B illustrate a manufacturing method of the FET according to a first variation of the fourth embodiment.

Figure 19A:
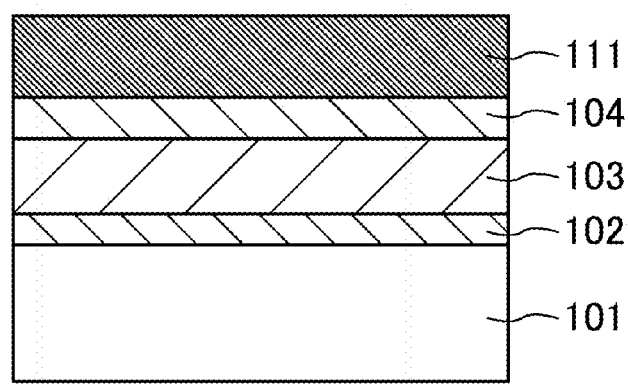
FIGS. 19A-19C are cross-sectional views illustrating a method of manufacturing a semiconductor device according to a first variation of the fourth embodiment in order of steps.

First, as shown in FIG. 19A, the buffer layer 102, the carrier traveling layer 103, the barrier layer 104, and the p-type the gate control layer 111, which are made of group III nitride semiconductor, are sequentially epitaxially grown on the principal surface of the Si substrate 101. Then, annealing is performed to activate the p-type dopant.

Figure 19B:
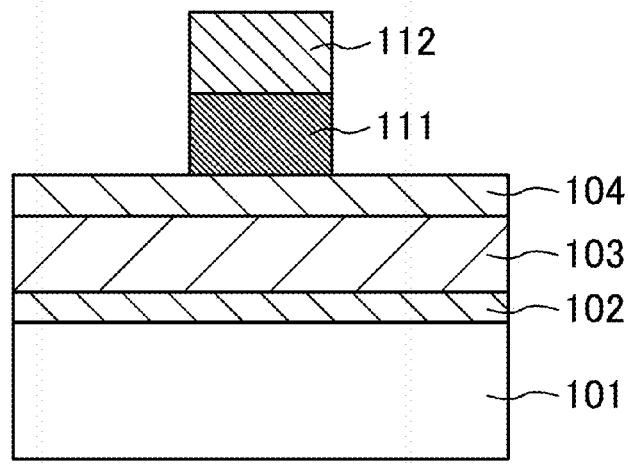

Next, a mask layer 112 made of silicon dioxide (e.g., $SiO_2$) or SiN is formed on the entire surface of the gate control layer 111. Then, as shown in FIG. 19B, the gate control layer 111 and the mask layer 112 are removed by dry etching to leave the upper portions, which are the region for forming the gate electrode. In this case, the etching is preferably stopped at the surface of the barrier layer 104 to reduce a damage of the dry etching. Since reduction in the thickness of the barrier layer 104 contributes to an increase in the carrier density, the barrier layer 104 may be partially etched as far as it does not raise the sheet resistance.

Figure 19C:
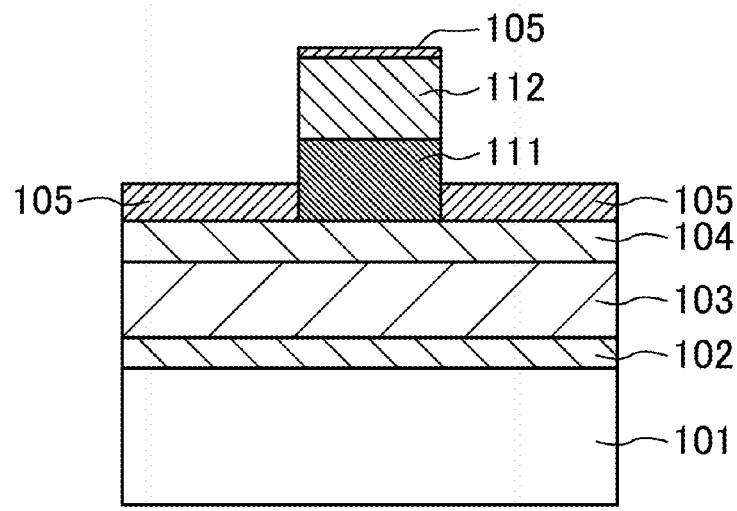

After that, as shown in FIG. 19C, the AlN cap layer 105 grown at the low temperature is formed to cover the barrier layer 104 using the mask layer 112 formed on the gate control layer 111 as a mask. At this time, the cap layer 105 is also formed on the mask layer 112. However, being polycrystal or amorphous, the portion of the cap layer 105 formed on the mask layer 112 is removed at the same time when the mask layer 112 is removed with solution such as hydride fluoric acid, etc.

Figure 20A:
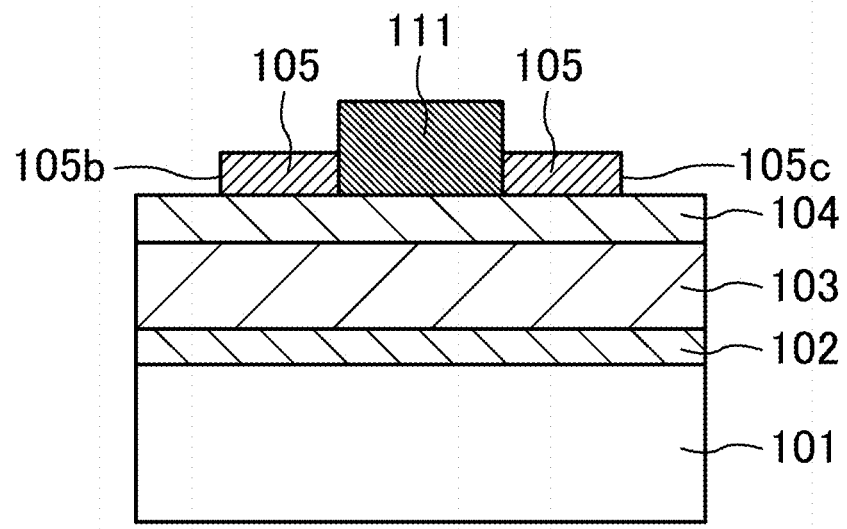
FIGS. 20A and 20B are cross-sectional views illustrating the method of manufacturing the semiconductor device according to the first variation of the fourth embodiment in order of steps.

Then, as shown in FIG. 20A, after removing the mask layer 112, the second opening 105b and the third opening 105c are formed in the cap layer 105. After that, the source electrode 107 and the drain electrode 108 are formed in the second opening 105b and the third opening 105c, respectively. After that, the source electrode 107 and the drain electrode 108 are subjected to heat treatment to obtain ohmic characteristics.

Figure 20B:
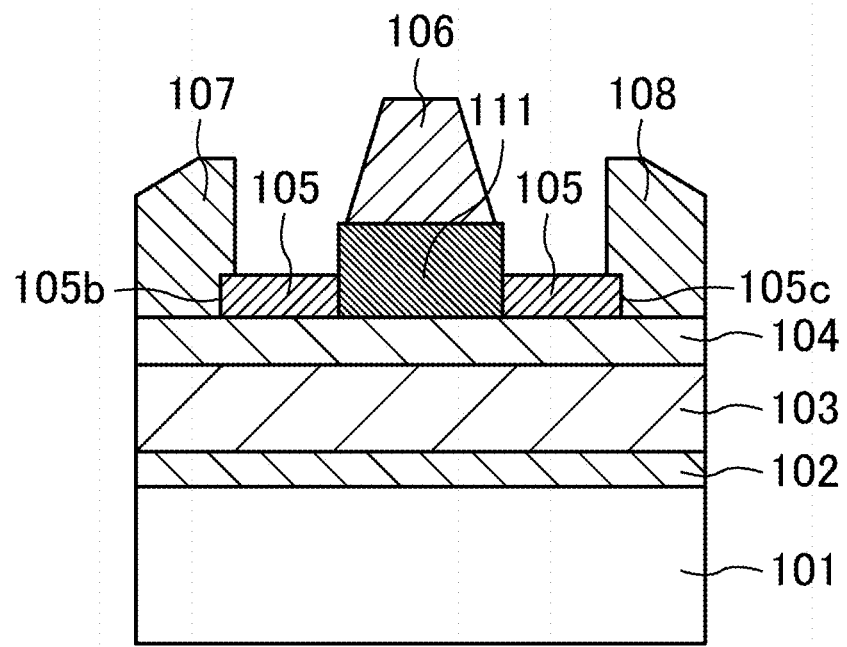

Next, as shown in FIG. 20B, the gate electrode 106 is selectively formed on the gate control layer 111.

4E. Second Variation

FIGS. 21A-22C illustrate a manufacturing method of the FET according to a second variation of the fourth embodiment. In the second variation, the cap layer 105 is formed earlier than the gate control layer 111.

Figure 21A:
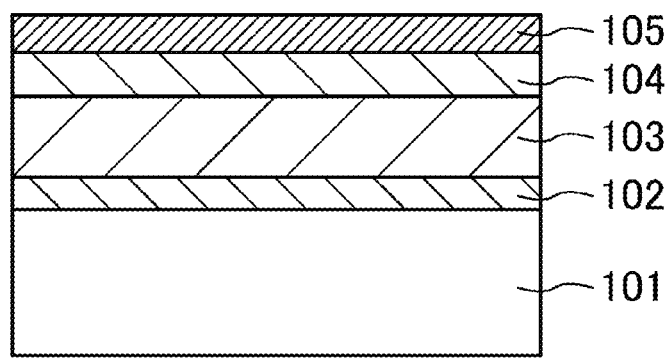
FIGS. 21A-21C are cross-sectional views illustrating a method of manufacturing a semiconductor device according to a second variation of the fourth embodiment in order of steps.

First, as shown in FIG. 21A, the buffer layer 102, the carrier traveling layer 103, the barrier layer 104, and the cap layer 105, which are made of group III nitride semiconductor, are sequentially stacked on the principal surface of the Si substrate 101.

Figure 21B:
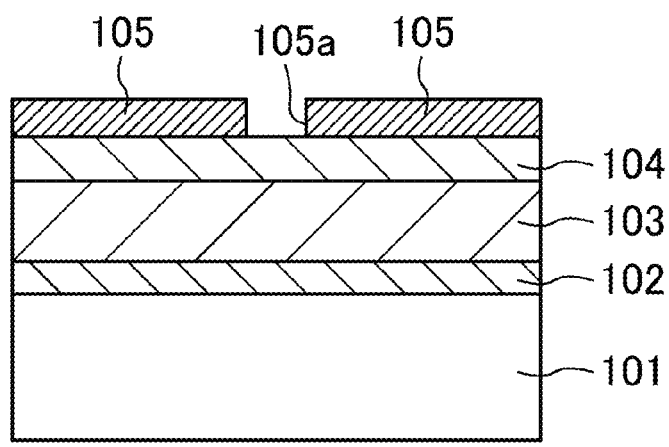

Then, as shown in FIG. 21B, the first opening 105a for forming the gate control layer is formed in the cap layer 105.

Figure 21C:
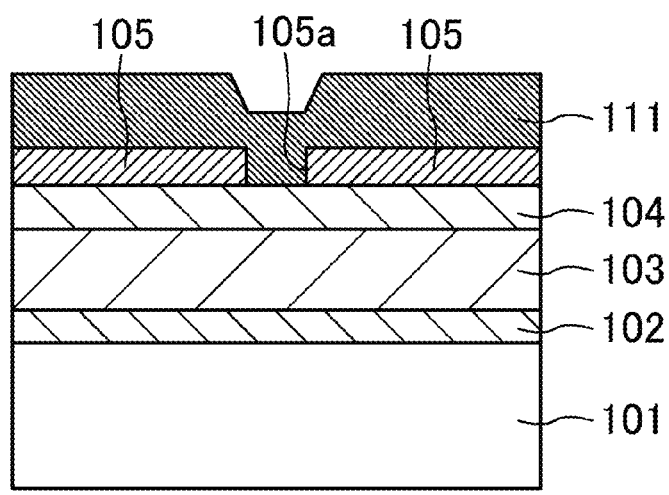

Next, as shown in FIG. 21C, the p-type the gate control layer 111 is formed by crystal growth on the upper surface of the cap layer 105 and on the portion of the bather layer 104, which is exposed from the first opening 105a of the cap layer 105. After that, annealing is performed to activate the p-type dopant.

Figure 22A:
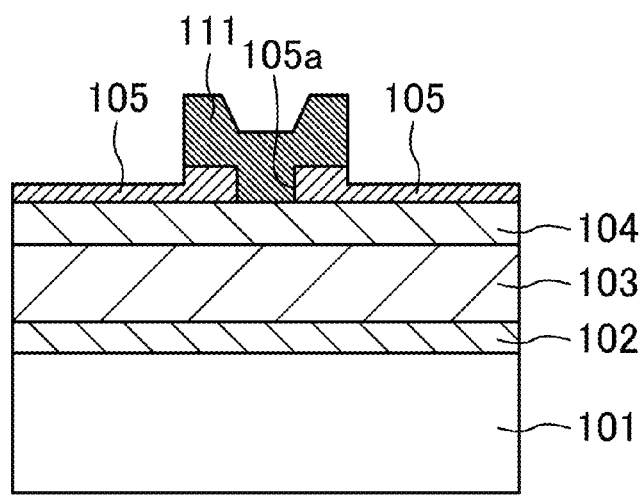
FIGS. 22A-22C are cross-sectional views illustrating the method of manufacturing the semiconductor device according to the second variation of the fourth embodiment in order of steps.

After that, as shown in FIG. 22A, the gate control layer 111 is dry etched to leave the region for forming the gate electrode.

Figure 22B:
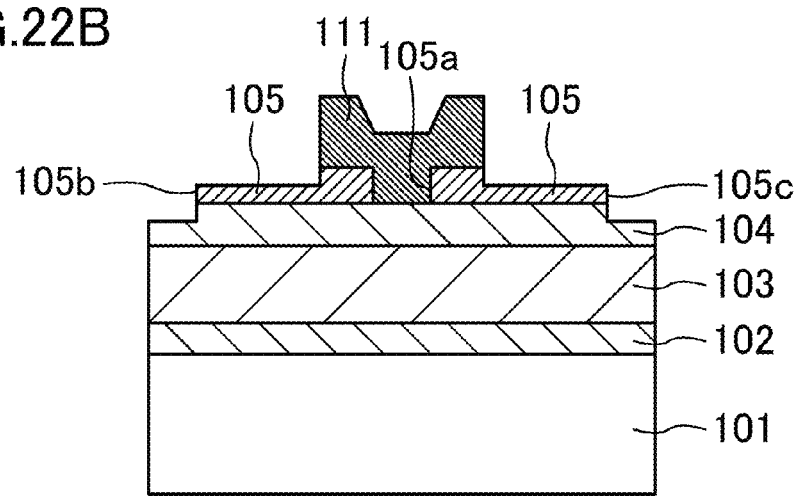

Then, as shown in FIG. 22B, the second opening 105b and the third opening 105c are selectively formed in the cap layer 105. At this time, the openings 105b and 105c are formed by dry etching. Where the openings 105b and 105c are formed by wet etching, the cap layer 105 is baked to be tight in the growth and activation annealing of the gate control layer 111. While this does not form single crystals but strengthens the bonding, thereby causing an etching residue.

Figure 22C:
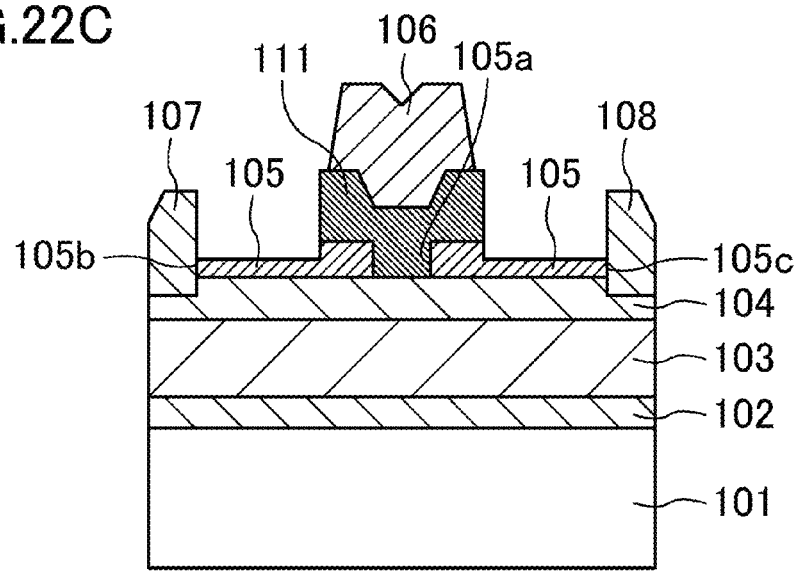

Next, as shown in FIG. 22C, a source electrode 107 and a drain electrode 108 are formed in the second opening 105b and the third opening 105c of the cap layer 105, respectively. After that, the source electrode 107 and the drain electrode 108 are subjected to heat treatment to obtain ohmic characteristics. Then, the gate electrode 106 is selectively formed on the gate control layer 111.

4F. Third Variation

A FET according to a third variation of the fourth embodiment will be described below with reference FIG. 23.

Figure 23:
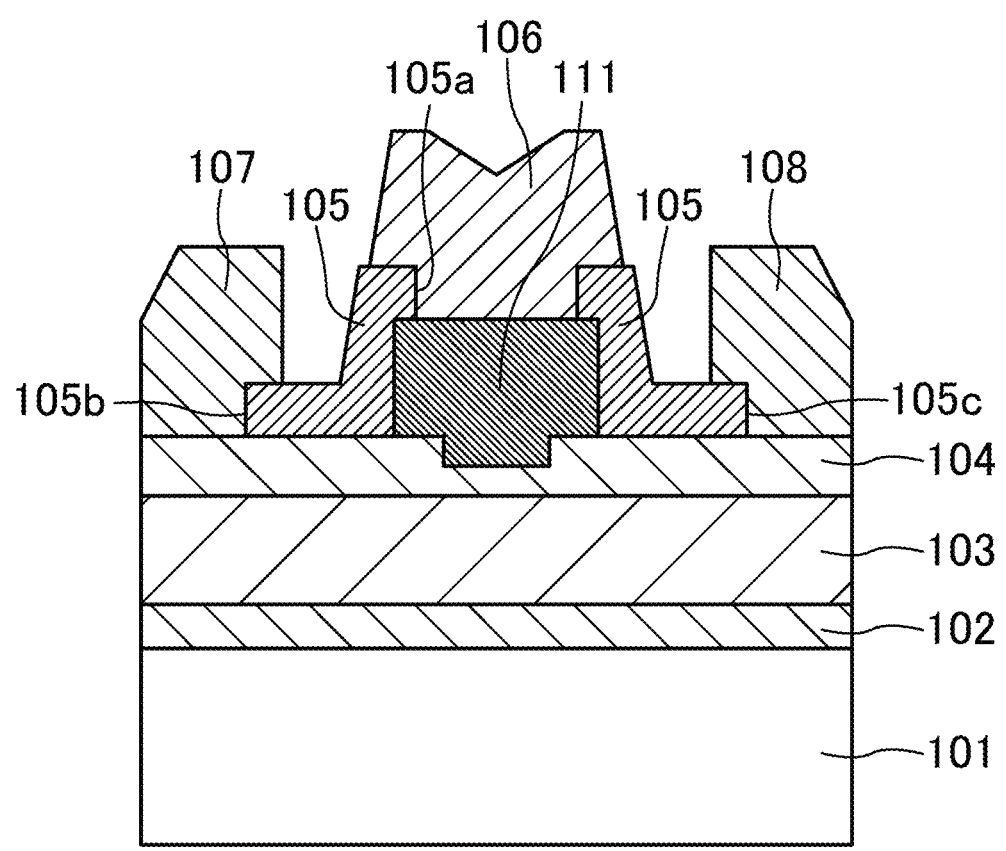
FIG. 23 is a schematic cross-sectional view illustrating a semiconductor device according to a third variation of the fourth embodiment.

As shown in FIG. 23, in the FET according to the third variation, different from the FET according to the fourth embodiment shown in FIG. 16, the thickness of the region of a barrier layer 104 for forming a gate control layer 111 is partially smaller than that of the other region.

As such, the thickness of the region of the barrier layer 104 for forming the gate control layer 111 is partially reduced, thereby increasing the controllability of the FET by the gate electrode 106. The threshold voltage is determined by adjusting the thickness of the barrier layer 104 at the portion below the gate electrode 106.

4G. Passivation Film in FET of Fourth Embodiment

The surface of the AlN cap layer 105 forming the FET according to the fourth embodiment and the variations is covered by, for example, a SiN passivation film, thereby inactivating the surface of the cap layer 105. This improves the device characteristics. For example, the amount of current increases, and a current collapse phenomenon decreases.

In the FET according to this embodiment, the passivation film may be a $SiO_2$ film, etc. instead of the SiN film.

4H. Source Electrode and Drain Electrode in FET of First to Fourth Embodiments

Figure 24A:
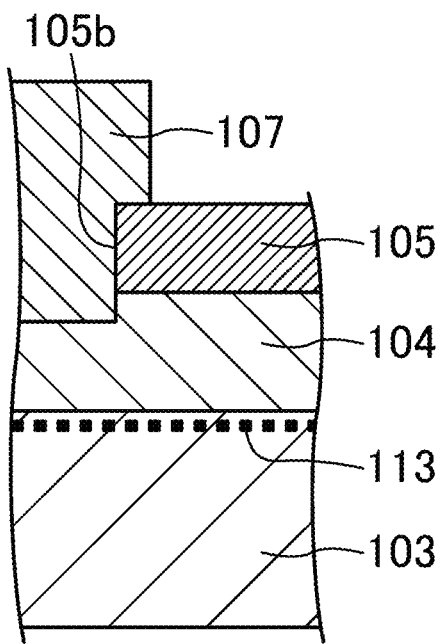
FIGS. 24A and 24B are enlarged schematic cross-sectional views illustrating a lower end of a source electrode in a semiconductor device according to another variation of the fourth embodiment.

In each of the FETs according to the first to fourth embodiments, as shown in FIG. 24A, the second opening 105b of the cap layer 105 may be formed to be dug into the upper portion of the barrier layer 104. A source electrode may be provided to fill the second opening 105b.

Figure 24B:
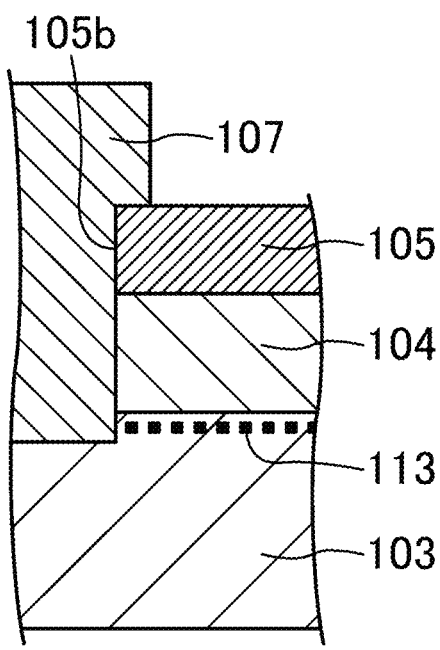

As shown in FIG. 24B, the second opening 105b of the cap layer 105 may be dug into the upper portion of the carrier traveling layer 103 so that the source electrode 107 extends across a 2DEG layer 113. The source electrode may be provided to fill the second opening 105b.

These structures reduce the resistance of the source electrode 107.

Similar to the source electrode 107, the drain electrode 108 may be provided as shown in FIGS. 24A and 24B.

Fifth Embodiment

A group III nitride semiconductor device according to a fifth embodiment of the present disclosure will be described below with reference to FIG. 25.

Figure 25:
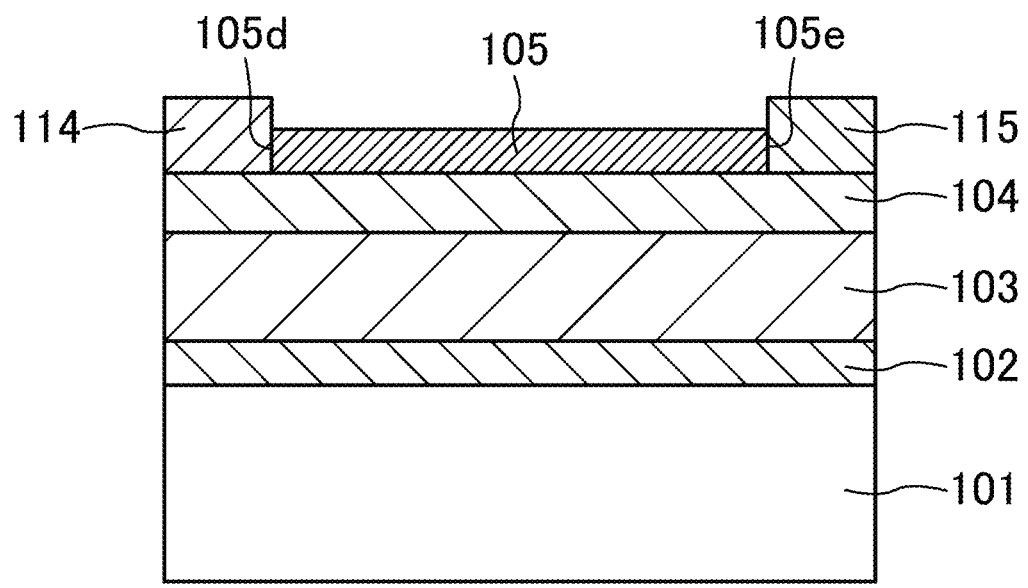
FIG. 25 is a schematic cross-sectional view illustrating a semiconductor device according to a fifth embodiment of the present disclosure.

The semiconductor device according to the fifth embodiment shown in FIG. 25 is what is called a Schottky diode (SD).

As shown in FIG. 25, the SD according to this embodiment is formed by sequentially epitaxially growing a buffer layer 102, a carrier traveling layer 103, and a barrier layer 104, which are made of group III nitride semiconductor, on the principal surface of a Si substrate 101 whose plane orientation is the (111) plane. An AlN cap layer 105 containing a mixture of single crystals and polycrystals is formed on the barrier layer 104. The group III nitride semiconductor in this embodiment is $Al_zGa_{1-z}N$, where $0 \leq Z \leq 1$. The layers between the buffer layer 102 and the cap layer 105 have configurations, for example, similar to those in the first embodiment.

The group III nitride semiconductor containing the mixture of single crystals and polycrystals forming the cap layer 105, i.e., AlN is as described above in the first embodiment.

A first opening 105d exposing the barrier layer 104 is formed in the cap layer 105. A Schottky electrode 114 made of Ni and Au is formed in the first opening 105d.

A second opening 105e exposing the barrier layer 104 is formed in the cap layer 105 in a region apart from the Schottky electrode 114 by a predetermined distance. An ohmic electrode 115 made of Ti and Al is formed in the second opening 105e.

Similar to the FET according to the first embodiment, the SD according to this embodiment may be manufactured by MOCVD.

In the SD according to this embodiment, the AlN cap layer 105 containing the mixture of single crystals and polycrystals is provided on the barrier layer 104, thereby partially increasing the carrier concentration of the carrier traveling layer 103. Since the resistance of the carrier traveling layer 103 decreases, the on-resistance of the SD decreases.

A p-type group III nitride semiconductor layer may be provided between the barrier layer 104 and the Schottky electrode 114. In this case, an ohmic electrode forming ohmic contact with the p-type group III nitride semiconductor layer may be used instead of the Schottky electrode 114.

As shown in FIGS. 24A and 24B, the ohmic electrode 115 may be dug into the upper portion of the carrier traveling layer 103 or the upper portion of the barrier layer 104.

The surface of the AlN forming the cap layer 105 is covered by a SiN passivation film, thereby inactivating the surface of the AlN. This improves the device characteristics. In the SD according to this embodiment as well, the passivation film may be a $SiO_2$ film, etc., instead of the SiN film.

Other Embodiments

In each of the semiconductor devices according to the first to fifth embodiments made of group III nitride semiconductor, the substrate 101 may be made of sapphire (single crystal $Al_2O_3$), silicon carbide (SiC), gallium nitride (GaN), aluminum nitride (AlN), etc., instead of silicon (Si).

The buffer layer 102 may be made of, for example, indium nitride (InN) instead of $Al_yGa_{1-y}N$, where $0 \leq y \leq 1$. Alternatively, it may be group III nitride semiconductor containing a quaternary alloy crystal, which is represented by $In_xAl_yGa_{1-x-y}N$, where $0 \leq x \leq 1$, $0 \leq y \leq 1$, $0 \leq x+y \leq 1$. The buffer layer 102 may be a multilayer of a plurality of semiconductor layers with not a single composition but different compositions. The buffer layer 102 may be doped with n-type impurities or p-type impurities.

The carrier traveling layer 103 may be made of InN or AlN instead of GaN. Alternatively, it may be group III nitride semiconductor containing a quaternary alloy crystal, which is represented by $In_xAl_yGa_{1-x-y}N$, where $0 \leq x \leq 1$, $0 \leq y \leq 1$, $0 \leq x+y \leq 1$. Out of them, the carrier traveling layer 103 is preferably made of GaN with excellent crystallinity, which reduces the influence of Coulomb scattering.

The barrier layer 104 may be made of, for example, GaN, InN, or AlN in accordance with the composition of the carrier traveling layer 103. Alternatively, it may be made of group III nitride semiconductor containing a ternary or quaternary alloy crystal represented by $In_xAl_yGa_{1-x-y}N$, where $0 \leq x \leq 1$, $0 \leq y \leq 1$, $0 \leq x+y \leq 1$. The bather layer 104 may be doped with n-type impurities to increase the density of the carriers generated in the 2DEG of the carrier traveling layer.

Where the barrier layer 104 is AlN with a thickness equal to or smaller than the critical thickness, the height of the barrier against the carrier traveling layer 103 increases, thereby reducing leakage current.

The cap layer 105 may be made of group III nitride semiconductor containing a ternary or quaternary alloy crystal represented by $In_xAl_yGa_{1-x-y}N$, where $0 \leq x \leq 1$, $0 \leq y \leq 1$, $0 \leq x+y \leq 1$, instead of AlN.

The cap layer 105 preferably contains Al, and particularly aluminum nitride (AlN), which increases the concentration of the 2DEG generated in the carrier traveling layer 103 by polarization. Alternatively, the surface may be oxidized to form an oxidation film such as an aluminum oxide film, which also functions as a layer blocking leakage current in forming the gate electrode.

The preferable band gap relation among the carrier traveling layer 103, the barrier layer 104, and the cap layer 105 is as follows.

Carrier Traveling Layer 103 < Barrier Layer 104 ≤ Cap Layer 105

As in the fourth embodiment, where the gate control layer 111 is provided between the gate electrode 106 and the barrier layer 104, the gate electrode 106 may be made of a metal, which can form ohmic contact with the gate control layer 111. For example, a metal such as nickel (Ni), platinum (Pt), palladium (Pd), gold (Au), or gold (Au) or an alloy of the metals may be used. Alternatively, a plurality of these metals may be deposited.

The source electrode 107 and the drain electrode 108 may be made of a metal, which can form ohmic contact with the 2DEG. Thus, the source electrode 107 and the drain electrode 108 may be made of, for example, a metal such as hafnium (Hf), tungsten (W), molybdenum (Mo), silicon (Si), titanium (Ti), platinum (Pt), niobium (Nb), aluminum (Al), gold (Au), nickel (Ni) or vanadium (V), or an alloy of the metals. Alternatively, they may be a multilayer of some of the metals.

In the first to fifth embodiments, the plane orientation of the principal surface of the Si substrate 101 is the (111) plane, and the plane orientation of the principal surface of the formed group III nitride semiconductor layer is the (0001) plane. As a result, the number of carriers is increased by the polarization in the carrier traveling layer 103, specifically, in the 2DEG layer.

In the first to fifth embodiments, the plane orientation of the principal surface of the group III nitride semiconductor layer may be other planes with polarity instead of the (0001) plane. For example, the plane orientation of the Si substrate 101 may be inclined from the (111) plane by some degrees so that the plane orientation of the principal surface of the group III nitride semiconductor layer is the plane, which is inclined from the (0001) plane by some degrees.

In each of the semiconductor devices according to the first to fourth embodiments, the gate length of the gate electrode 106 may be determined as appropriate in accordance with the specifications of the FET.

In each of the semiconductor devices according to the first to fourth embodiments, the distance between the gate electrode 106 and the source electrode 107, and the distance between the gate electrode 106 and the drain electrode 108 may be determined as appropriate in accordance with the specifications of the FET. It is also applicable to the distance between the ohmic electrode 115 and the Schottky electrode 114 in the SD according to the fifth embodiment.

In each of the semiconductor device according to the first to fifth embodiments, the thickness of the substrate, the thicknesses of the semiconductor layers, the thickness of the passivation film, the thicknesses of the electrodes, etc., may be determined as appropriate in accordance with the specifications of the semiconductor device.

In each of the semiconductor devices according to the first to fourth embodiments, the distance between the source electrode 107 and the gate electrode 106 is almost equal to the distance between the drain electrode 108 and the gate electrode 106. In order to increase the breakdown voltage of the semiconductor device, the distance between the drain electrode 108 and the gate electrode 106 is preferably greater than the distance between the source electrode 107 and the gate electrode 106.

In each of the semiconductor devices according to the first to fifth embodiments, although not shown, a field plate such as a known source field plate or a known gate field plate for reducing the electric field may be provided to increase the breakdown voltage of the semiconductor device.

In the first to fifth embodiments, the field effect transistors (FETs) and the Schottky diode (SD) have been described as example group III nitride semiconductor devices. The present disclosure is not limited thereto and is applicable to other semiconductor devices, for example, a heterojunction bipolar transistor (HBT) or a heterojunction pn diode.

The semiconductor device and the method of manufacturing the device according to the present disclosure are particularly useful for group III nitride semiconductor devices exhibiting normally-off characteristics.

What is claimed is:

1. A semiconductor device comprising:
a substrate;
a carrier traveling layer formed on the substrate, made of first group III nitride semiconductor, and containing carriers traveling in a direction along a principal surface of the substrate;
a barrier layer formed on the carrier traveling layer and made of second group III nitride semiconductor having a wider band gap than the first group III nitride semiconductor;
an electrode formed on the barrier layer; and
a cap layer formed on the barrier layer at a side of the electrode, and made of third group III nitride semiconductor containing a mixture of single crystals and polycrystals,
wherein the single crystals takes over a crystal structure of the barrier layer.

2. The semiconductor device of claim 1, wherein
the single crystals are disposed on an interface with the barrier layer.

3. The semiconductor device of claim 2, wherein
the single crystals are formed non-uniformly in a thickness along the interface with the barrier layer.

4. The semiconductor device of claim 1, wherein
the single crystals comprises a single crystal layer disposed on the interface with the barrier layer and an insular single crystal portion disposed on the single crystal layer.

5. The semiconductor device of claim 1, wherein
the cap layer is made of group III nitride semiconductor containing aluminum (Al).

6. The semiconductor device of claim 5, wherein
a surface of the cap layer opposite to the substrate is oxidized.

7. The semiconductor device of claim 1, wherein
the cap layer is made of aluminum nitride (AlN), the barrier layer is made of $Al_xGa_{1-x}N$, where $0<x\leq1$, and the carrier traveling layer is made of GaN.

8. The semiconductor device of claim 1, further comprising:
a spacer layer provided between the carrier traveling layer and the barrier layer, and made of single crystal aluminum nitride (AlN).

9. The semiconductor device of claim 1, further comprising:
a p-type group III nitride semiconductor layer provided between the barrier layer and the electrode.

10. The semiconductor device of claim 9, wherein
the p-type group III nitride semiconductor layer is made of $Al_xGa_{1-x}N$, wherein $0\leq x\leq1$.

11. The semiconductor device of claim 1, further comprising:
an insulating layer provided between the barrier layer and the electrode.

12. The semiconductor device of claim 11, wherein
the insulating layer is made of aluminum oxide ($Al_2O_3$).

13. The semiconductor device of claim 1, wherein
a portion of the barrier layer under the electrode has a smaller thickness than the side of the electrode.

14. The semiconductor device of claim 1, wherein
a sheet carrier concentration in the carrier traveling layer is more than $1\times10^{13}$ cm$^{-2}$.

15. The semiconductor device of claim 1, wherein the single crystals have higher etching resistivity to an alkaline solution than the polycrystals.

16. The semiconductor device of claim 1, wherein a crystalline size of the single crystals is greater than crystal sizes of the polycrystals.

17. The semiconductor device of claim 2, wherein
the single crystals comprise a plurality of insular single crystal portions.

18. The semiconductor device of claim 17, wherein the plurality of insular single crystal portions are covered by the polycrystals.

* * * * *